United States Patent
Suzuki et al.

(10) Patent No.: US 6,174,174 B1
(45) Date of Patent: Jan. 16, 2001

(54) SOCKET FOR IC AND METHOD FOR MANUFACTURING IC

(75) Inventors: Kenzo Suzuki; Toshimasa Hiroike; Hiroshi Nagano; Hisataka Izawa; Yasuo Maru; Shigeo Ikeda, all of Kanagawa (JP)

(73) Assignees: Sony Corporation; Tokyo Cosmos Electric Co., Ltd., both of Tokyo (JP)

( * ) Notice: Under 35 U.S.C. 154(b), the term of this patent shall be extended for 0 days.

(21) Appl. No.: 09/380,766

(22) PCT Filed: Nov. 5, 1999

(86) PCT No.: PCT/JP98/05504

§ 371 Date: Sep. 28, 1999

§ 102(e) Date: Sep. 28, 1999

(87) PCT Pub. No.: WO99/37001

PCT Pub. Date: Jul. 22, 1999

(30) Foreign Application Priority Data

Jan. 16, 1998 (JP) .................................................. 10-006531
Apr. 8, 1998 (JP) .................................................. 10-096341
Jul. 21, 1998 (JP) .................................................. 10-204623

(51) Int. Cl.[7] .................................................. H01R 12/00
(52) U.S. Cl. .................................................. 439/71; 439/66; 439/91; 439/931
(58) Field of Search .................................. 439/65, 66, 68, 439/71, 72, 74, 75, 91, 330, 331, 608, 941, 245, 247, 886, 931, 817

(56) References Cited

U.S. PATENT DOCUMENTS

| | | | |
|---|---|---|---|
| 4,806,111 | * 2/1989 | Nishi et al. | 439/931 |
| 5,158,470 | * 10/1992 | Zarreii | 439/931 |
| 5,399,982 | * 3/1995 | Driller et al. | 439/66 |
| 5,518,410 | * 5/1996 | Masami | 439/71 |
| 5,540,593 | * 7/1996 | Takahashi | 439/66 |
| 5,727,954 | * 3/1998 | Kato et al. | 439/66 |
| 5,791,914 | * 8/1998 | Loranger et al. | 439/71 |

FOREIGN PATENT DOCUMENTS

| | | |
|---|---|---|
| 2-210780 | 8/1990 | (JP) . |
| 6-260568 | 9/1994 | (JP) . |
| 10-340773 | 12/1998 | (JP) . |

* cited by examiner

Primary Examiner—Gary F. Paumen
Assistant Examiner—Tho D. Ta
(74) Attorney, Agent, or Firm—Ronald P. Kananen; Rader, Fishman & Grauer

(57) ABSTRACT

A socket for an IC used in electrically connecting the IC to a test device for testing electrical properties of the IC. The socket for an IC includes a printed circuit board on one surface of which a plurality of contact electrodes are arranged at the same pitch as an arraying pitch of external electrodes for the IC and on the opposite surface of which are arranged a plurality of terminal electrodes connected to the contact electrodes, an anisotropic electrically conductive adhesive arranged on the contact electrodes of the printed circuit board, a base block arranged on the one surface of the printed circuit board and having an opening for setting the IC, with the opening facing the anisotropic electrically conductive adhesive. The socket for an IC also includes a plurality of coil-shaped contacts arranged in the opening, one ends of which are positioned above the contact electrodes via the anisotropic electrically conductive adhesive and the other ends of which are protruded from the opening. The contact electrodes and the coil-shaped contacts facing each other via the anisotropic electrically conductive adhesive are mechanically and electrically connected to each other via the anisotropic electrically conductive adhesive.

20 Claims, 30 Drawing Sheets

SOCKET FOR IC AND METHOD FOR MANUFACTURING IC

TECHNICAL FIELD

This invention relates to a socket used for inspecting a so-called inner surface mounting type IC having a bump arranged and formed on a bottom surface of the main body portion of the IC, and a manufacturing method for manufacturing the IC using this socket.

BACKGROUND ART

Up to now, a socket configured as shown in FIG. 1 is used as a socket for pre-shipment inspection of the inner surface mounting type IC. This socket includes a pre-set number of contact terminals 3 arranged in a main body portion 2. Referring to FIG. 1, the portion of the contact terminal 3 lying within the main body portion 2 of the socket is bowed to follow a stepped portion in the main body portion 2 of the socket, with a distal end of the contact terminal 3 operating as a contact portion 3a and a portion of the contact terminal 3 protruded from the bottom surface of the main body portion 2 of the socket operating as a terminal 3b. A retainer member 5 is rotationally mounted via a hinge 4 on the main body portion 2 of the socket.

An IC 6 to be housed in the socket 1 is housed in its main body portion 2 with a bump 7 as an external electrode on the bottom surface of a main body portion 8 of the IC in position for contacting with a contact portion 3a of a contact terminal 3 arranged in the main body portion 2 of the socket. The IC 6 is thrust and supported in position by a thrusting portion 5a provided as a boss on a surface of the retainer member 5 which is rotated for closing an upper opening side of the main body portion 2 of the socket. When rotated for closing the opening side of the main body portion 2 of the socket to thrust and support the IC 6 housed in the main body portion 2 of the socket, as shown in FIG. 1, the retainer member 5 is locked by a lock member, not shown, provided in the main body portion 2 of the socket, whereby the IC 6 is kept in the thrust and supported state.

The above-described socket 1 can be used for such a case wherein the bump arraying pitch is broader and wherein two rows of bumps are each arranged on opposite sides of the bottom of the main body portion 8 of the IC, as shown in FIG. 1. However, the above-described configuration cannot be applied to a ball grid array (BGA) type IC or to a chip size package (CSP) type IC in which a large number of bumps are arranged in a matrix configuration on the bottom of the main body portion of the IC. That is, in the socket 1 shown in FIG. 1, contact portions 3a of contact terminals 3 constituted by metal pins are bowed for extending along the bottom surface of the main body portion 2 of the socket, plural bumps formed on the BGA type or CSP type IC are simultaneously contacted with the sole contact portions 3a to render it impossible to cause the bumps and the contact portions 3a to be contacted with each other independently.

DISCLOSURE OF THE INVENTION

It is an object of the present invention to provide a socket for an IC which renders it possible to house an IC on the main body portion of which a large number of bumps as external electrodes are mounted in a matrix configuration.

It is another object of the present invention to provide a socket for an IC in which an IC can be housed therein in a condition in which a large number of bumps of the IC arranged at a narrow pitch in a matrix configuration are connected with high electric and mechanical reliability to the electrodes provided on the socket.

It is still another object of the present invention to provide an socket for an IC which is high in durability and reliability.

It is still another object of the present invention to provide an socket for an IC having optimum electrical properties such as low resistance value and low inductance value of a connection conductor electrically connected to the external electrodes provided on the IC.

It is still another object of the present invention to provide an socket for an IC wherein the value of the connection resistance across the external electrodes provided on the IC and the contact electrodes provided on the socket can be reduced further.

It is a further object of the present invention to provide a socket for an IC wherein crosstalk between contacts provided on the socket can be reduced to prevent deterioration of transmitted signals.

It is a further object of the present invention to provide a manufacturing method for an IC whereby an IC of high reliability can be produced by reliable electrical and mechanical connection between the external electrodes provided on the IC and the terminals provided on the socket adapted for housing the IC.

It is a further object of the present invention to provide a manufacturing method for an IC whereby the value of the connection resistance across the external electrodes provided on the IC and the contact electrodes provided on the socket can be reduced further.

It is yet another object of the present invention to provide a manufacturing method for an IC whereby the crosstalk between contacts provided on the socket can be reduced to prevent deterioration of transmitted signals.

In one aspect, the present invention provides a socket for an IC including a printed circuit board on one surface of which a plurality of contact electrodes are arranged at the same pitch as an arraying pitch of external electrodes for the IC and on the opposite surface of which are arranged a plurality of terminal electrodes connected to the contact electrodes, an anisotropic electrically conductive adhesive arranged on the contact electrodes of the printed circuit board, a base block arranged on the one surface of the printed circuit board and having an opening for setting the IC therein, the opening facing the anisotropic electrically conductive adhesive, and a plurality of coil-shaped contacts arranged in the opening, one ends of which are positioned above the contact electrodes via the anisotropic electrically conductive adhesive and the other ends of which are protruded from the opening. The contact electrodes and the coil-shaped contacts facing each other via the anisotropic electrically conductive adhesive are mechanically and electrically connected to each other via the anisotropic electrically conductive adhesive.

In another aspect, the present invention provides a socket for an IC including a printed circuit board on one surface of which a plurality of contact electrodes are arranged at the same pitch as an arraying pitch of external electrodes for the IC and on the opposite surface of which are arranged a plurality of terminal electrodes respectively connected to the contact electrodes, a base block for setting the IC therein, the base block being arranged on the one surface of the printed circuit board and having a plurality of through-holes facing sais contact electrodes, an electrically conductive film formed on an inner peripheral surface of each of the through-holes, and a plurality of coil-shaped contacts arranged in the plural through-holes, one ends of the coil-shaped contacts being contacted with the contact electrodes and the opposite ends thereof being protruded from the through-holes. The coil-shaped contacts are thrust at the opposite ends thereof by the external electrodes of the IC so that the coil-shaped contacts are contacted with the electrically conductive films provided in the through-holes. The electrically conductive films operate in conjunction with the coil-shaped contacts as a connecting conductor between the external electrodes of the IC and the contact electrodes.

In still another aspect, the present invention provides a socket for an IC including a printed circuit board on one surface of which a plurality of contact electrodes are arranged at the same pitch as an arraying pitch of external electrodes for the IC and on the opposite surface of which are arranged a plurality of terminal electrodes respectively connected to the contact electrodes, a base block for setting the IC therein, the base block being arranged on the one surface of the printed circuit board and having a plurality of through-holes facing sais contact electrodes, a magnetic film formed on an inner peripheral surface of each of the through-holes, and a plurality of coil-shaped contacts arranged in the plural through-holes. One ends of the coil-shaped contacts are contacted with the contact electrodes and the other ends thereof are protruded from the through-holes.

In yet another aspect, the present invention provides a method for producing an IC using a socket for an IC including a printed circuit board on one surface of which a plurality of contact electrodes are arranged at the same pitch as an arraying pitch of external electrodes for the IC and on the opposite surface of which are arranged a plurality of terminal electrodes connected to the contact electrodes, an anisotropic electrically conductive adhesive arranged on the contact electrodes of the printed circuit board, a base block arranged on the one surface of the printed circuit board and having an opening for setting the IC therein, the opening facing the anisotropic electrically conductive adhesive, and a plurality of coil-shaped contacts arranged in the opening, one ends of which are positioned above the contact electrodes via the anisotropic electrically conductive adhesive and the other ends of which are protruded from the opening, the contact electrodes and the coil-shaped contacts facing each other via the anisotropic electrically conductive adhesive being mechanically and electrically connected to each other via the anisotropic electrically conductive adhesive. The method includes a step of testing electrical properties of the IC with the IC being set on the base block of the socket for contacting the external electrodes of the IC with the coil-shaped contacts, with the terminal electrodes being connected to a test board.

Other objects and advantages of the present invention will become clear from the following description of preferred embodiments and the appended claims.

BEST MODE FOR CARRYING OUT THE INVENTION

A socket for an IC 24 according to the present invention is hereinafter explained.

Figure 1:
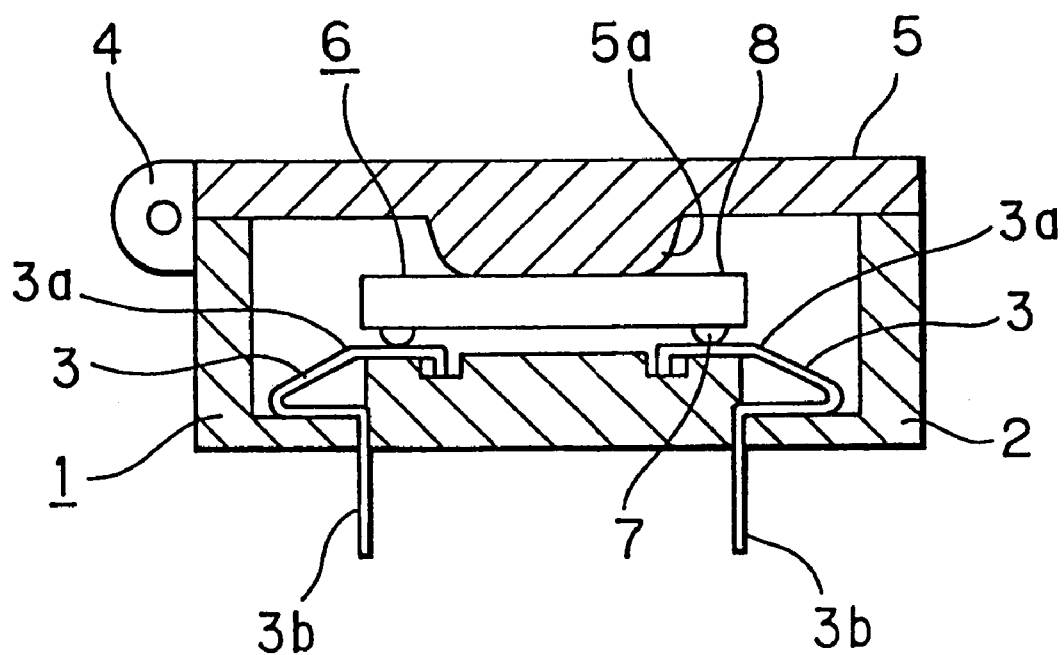
FIG. 1 is a cross-sectional view showing a conventional socket for an IC.
Figure 2:
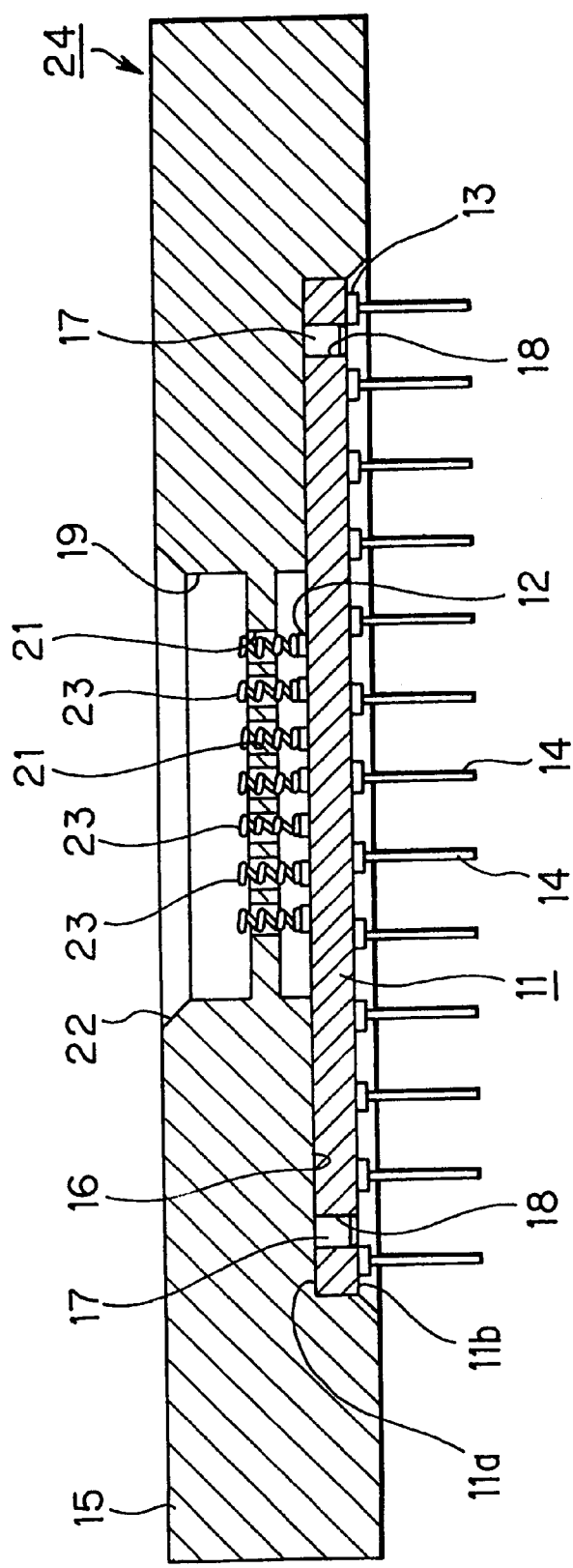
FIG. 2 is a cross-sectional view showing a typical example of a socket as a prior-art to the socket for the IC according to the present invention.
Figure 3:
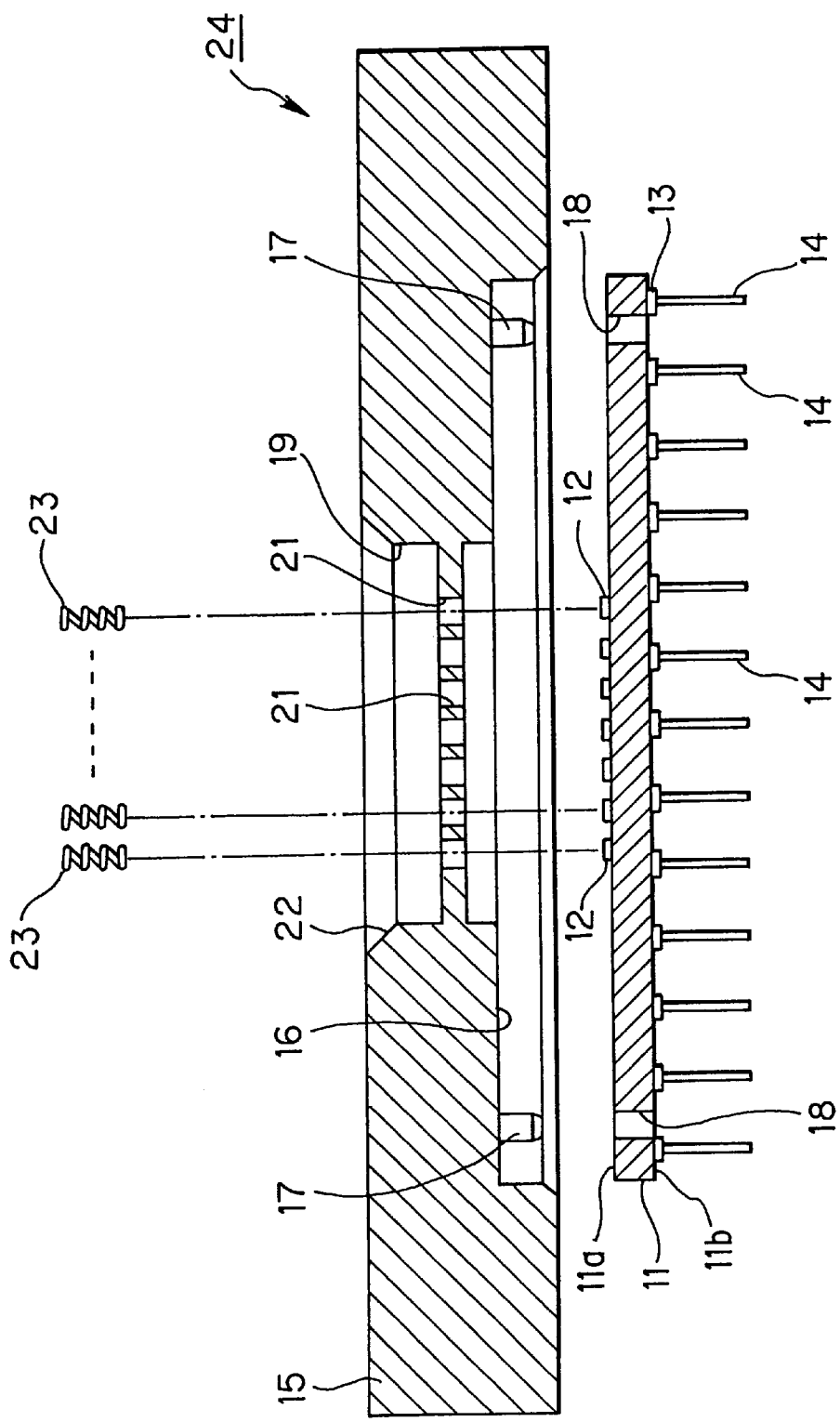
FIG. 3 is a cross-sectional view showing an assembled state of the socket for the IC shown in FIG. 2.
Figure 4:
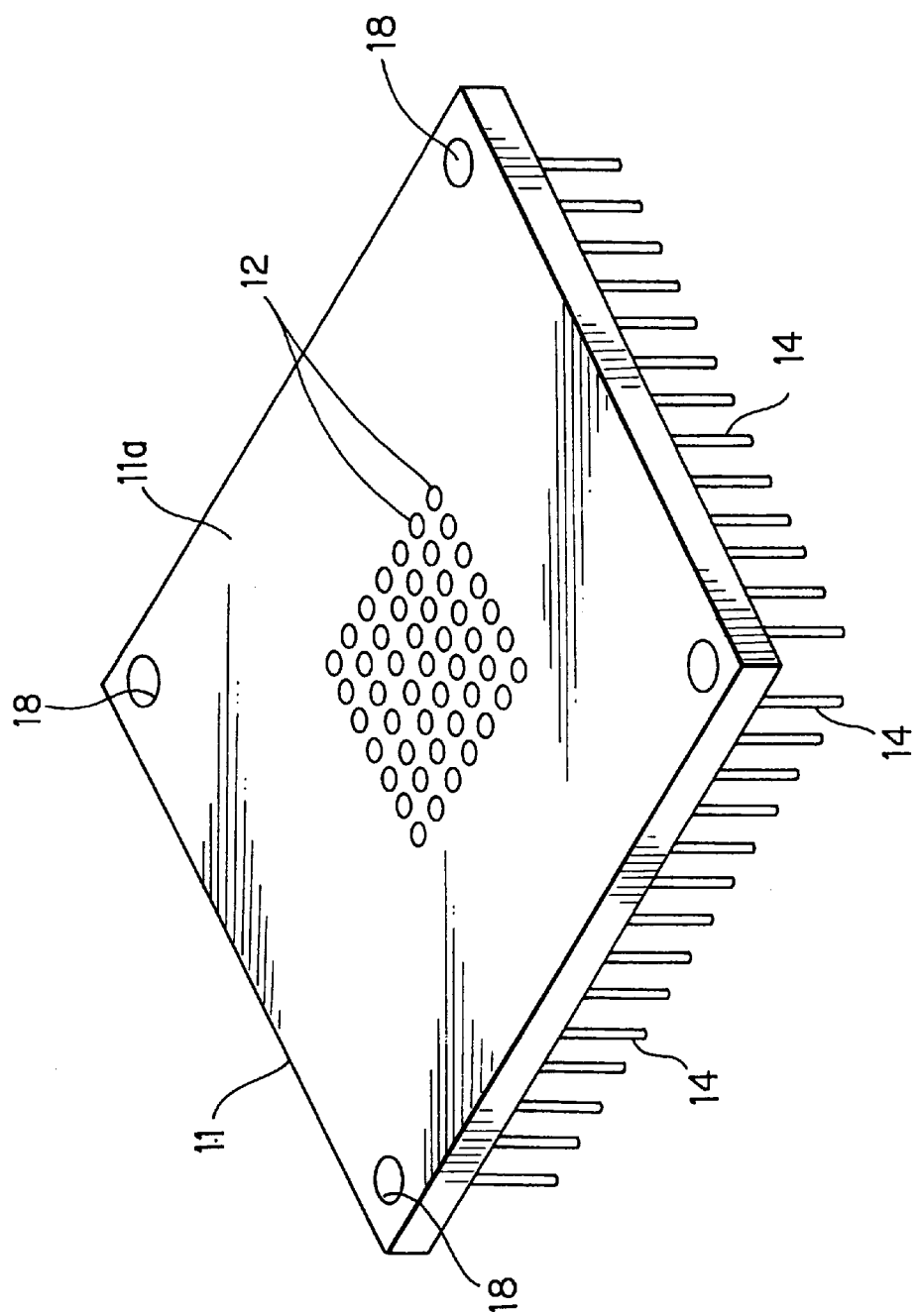
FIG. 4 is a perspective view showing a printed circuit board constituting the socket for the IC.

This socket for an IC 24, configured as shown in FIGS. 2 and 3, includes a printed circuit board 11 of a rectangular contour as shown in FIG. 4. Referring to FIG. 4, this printed circuit board 11 has plural contact electrodes 12 in a matrix configuration at a mid portion of a surface 11a thereof. The arraying pitch and the number of these contact electrodes 12 correspond to those of bumps of an IC loaded on the socket 24. In the embodiment shown in FIG. 4, 7 by 7 contact electrodes 12, totalling at 49, are arranged at a pitch of 0.05 mm.

On the opposite surface 11b of the printed circuit board 11, there are provided plural terminal electrodes 13 electrically connected to the contact electrodes 12 arranged on the surface 11a. These terminal electrodes 13 are formed by a multi-layered print wiring technique. The terminal electrodes 13 are enlarged in pitch with respect to the contact electrodes 12 and arranged along the four sides of the printed circuit board 11. The arraying pitch of the respective terminal electrodes 13 is approximately 2.5 mm. In the preferred embodiment, each contact electrode 12 is formed with a through-hole in which a pin terminal 14 is attached by inserting one end therein. Each pin terminal 14 is electrically connected to the terminal electrode 13.

The socket 24 of the present preferred embodiment is provided with a base block 15 formed of a synthetic resin, as shown in FIGS. 2 and 3. This base block 15 has, on its lower surface when seen in FIGS. 2 and 3, a rectangular first recess 16 in which to hold the printed circuit board 11. This first recess 16 has a depth deeper than the thickness of the printed circuit board 11 housed therein. At each corner of the first recess 16, there is protuberantly formed a connection pin 17, whereas, at each corner of the printed circuit board 11, there is formed a connection opening 18 into which is inserted the connection pin 17. The printed circuit board 11 is housed in the first recess 16 with the surface 11a formed with the contact electrodes 12 facing the base block 15 and with the connection pin 17 being inserted in the connection opening 18 for positioning. The printed circuit board 11 is mounted on the base block 15 by caulking the distal end of each connection pin 17 inserted into the associated connection opening 18.

In an upper surface of the base block 15 in FIGS. 2 and 3, that is a surface of the base block 15 opposite to its surface carrying the printed circuit board 11, there is formed a second recess 19 in which to hold an IC. In the bottom surface of the second recess 19 are bored plural through-holes 21 facing the contact electrodes 12 of the printed circuit board 11. The opening end side peripheral surface of the second recess 19 is flared to form an inclined surface 22 used for guiding insertion of an IC housed in position in this recess 19.

In the through-holes 21 in the base block 15 are introduced coil-shaped contacts 23, as shown in FIGS. 2 and 3. Each coil-shaped contact 23 has its one end positioned on and contacted with the contact electrode 12 of the printed circuit board 11, while having its other end slightly protruded into the second recess 19. Although the coil-shaped contacts 23 are simply inserted into the through-holes 21 in the present preferred embodiment, it may also have its one end secured to the contact electrode 12 of the printed circuit board 11 using e.g., an electrically conductive adhesive or a solder.

Figure 5:
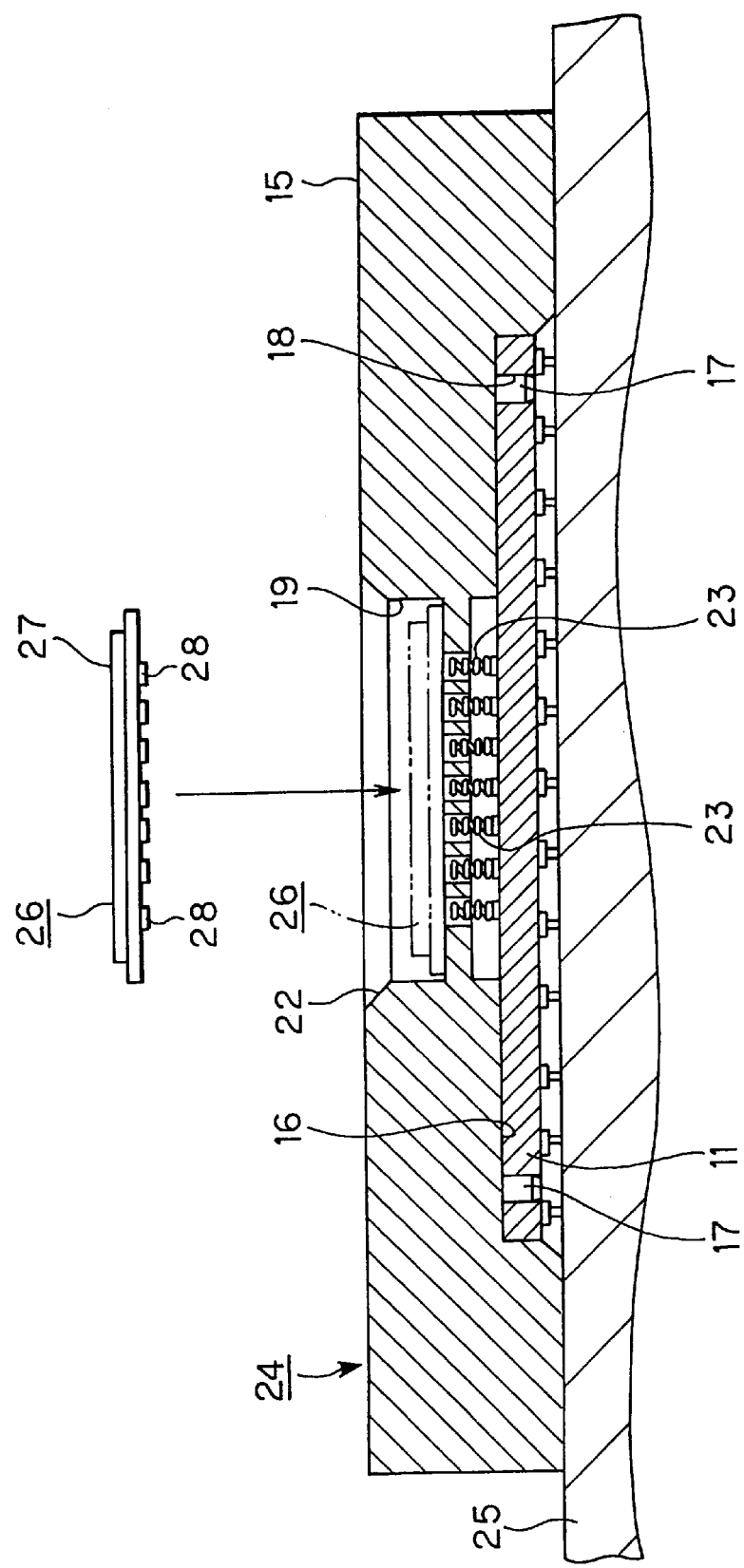
FIG. 5 is a cross-sectional view showing the state of loading an IC on the socket for the IC shown in FIG. 2.
Figure 6:
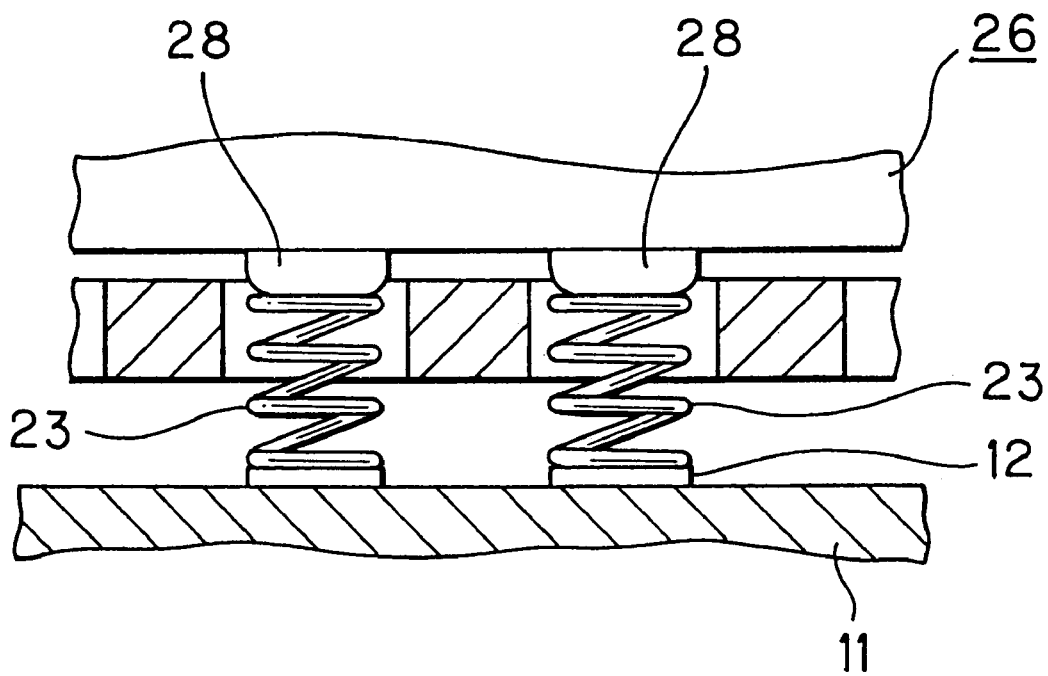
FIG. 6 is an enlarged cross-sectional view showing the contact state between the bumps provided on the IC and coil-shaped contacts.

In order to conduct a test on the IC 26, using the socket 24, constructed as described above, the socket 24 is mounted on a circuit substrate 25 for shipment inspection, as shown in FIG. 5. If then a main body portion of the IC 27 is housed in the second recess 19 of the base block 15, bumps 28 arranged as external electrodes in a matrix configuration on the lower surface of the main body portion of the IC 27 are set on the associated coil-shaped contacts 23. If the upper surface of the main body portion of the IC 27 is thrust by a supporting arm of a robot, for example, the coil-shaped contacts 23 are brought into pressure contact with the bumps 28, as shown in FIG. 6.

In the above-described socket 24, contact portions optimally contacted with the narrow-pitch IC bumps are constituted by the coil-shaped contacts 23 arranged in the through-holes 21 in the base block 15, and mounting terminal portions, derived with pitch conversion from the respective contact portions, are constituted by the printed circuit board 11 mounted on the base block 15, so that the socket can be applied to a ball grid array (BGA) or chip size package (CSP) type IC having a matrix array of a large number of bumps at a narrow pitch to assure facilitated IC inspection.

Meanwhile, the bumps provided on a routine IC are arrayed at a standard arraying pitch which is set to a constant value for different ICs. However, the number of the bumps and the outer size of the main body portion of the IC differ depending on different functions of the particular ICs. It is therefore desirable that the socket can be applied with universality to a variety of ICs having the common bump pitch and different numbers of the bumps.

Figure 7:
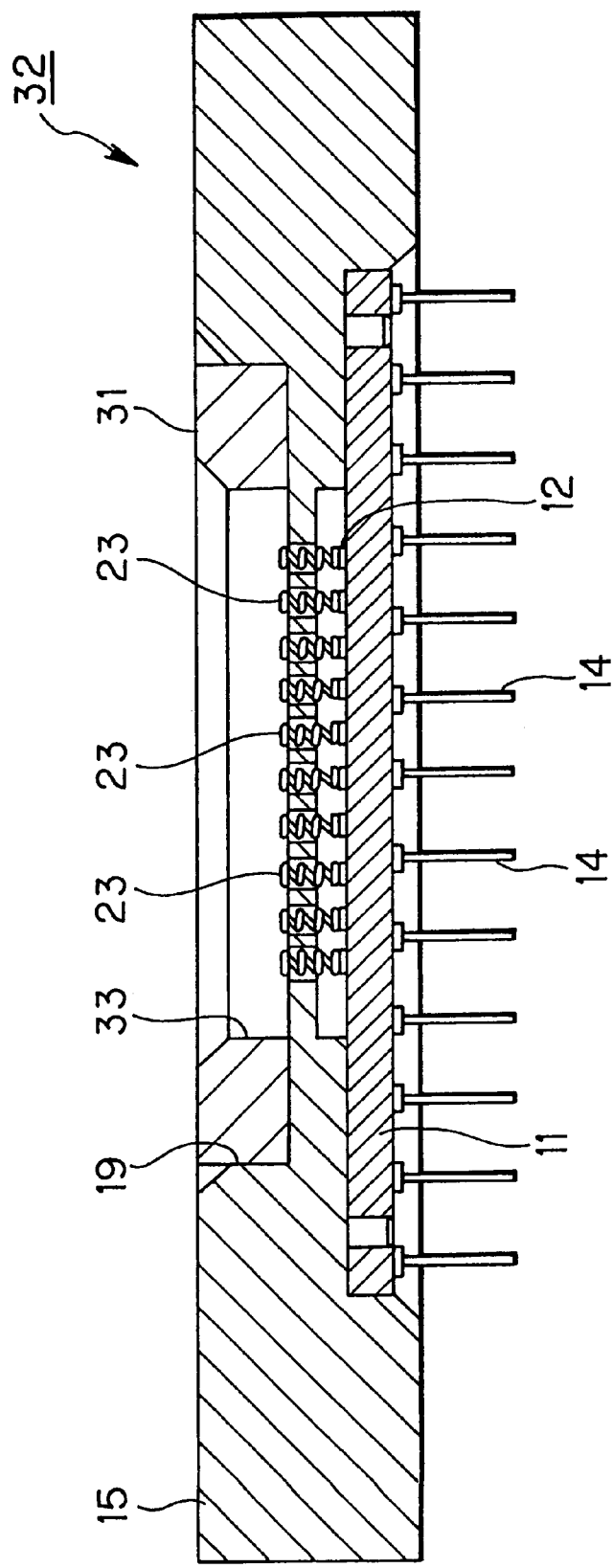
FIG. 7 is a cross-sectional view showing another typical example of a socket as a prior-art to the socket for the IC according to the present invention.

FIG. 7 shows a socket 32 that can be used with universality for different ICs having different numbers of the bumps. This socket 32 has a second recess 19 of an enlarged size for housing therein an IC provided on the base block 15. Specifically, the second recess 19 is sized to house an adapted 31 along with the IC therein. The IC housed in this second recess 19 is positioned by the adapter 31 housed in the second recess 19.

The number of the contact electrodes 12 formed in the printed circuit board 11 is equal to or slightly larger than the maximum number of the bumps of the ICs loaded on the socket 32. In the preferred embodiment, 10 by 10 contact electrodes 12, totalling at 100 contact electrodes 12, are arranged, and coil-shaped contacts 23 are arranged in association with these contact electrodes 12 on the base block 15. The adapter 31 is formed as a frame having a center IC accommodating hole 33 in which the IC is accommodated in position.

With the socket 32, shown in FIG. 7, it is possible to provide plural types of adapters 31 having different IC accommodating holes in association with various ICs having different outer sizes, and such adapter 31 as is suited for a particular IC is selected to permit the socket 32 to be used for inspection of a variety of ICs having different outer sizes, that is having the common bump pitch but different numbers of bumps.

Figure 8:
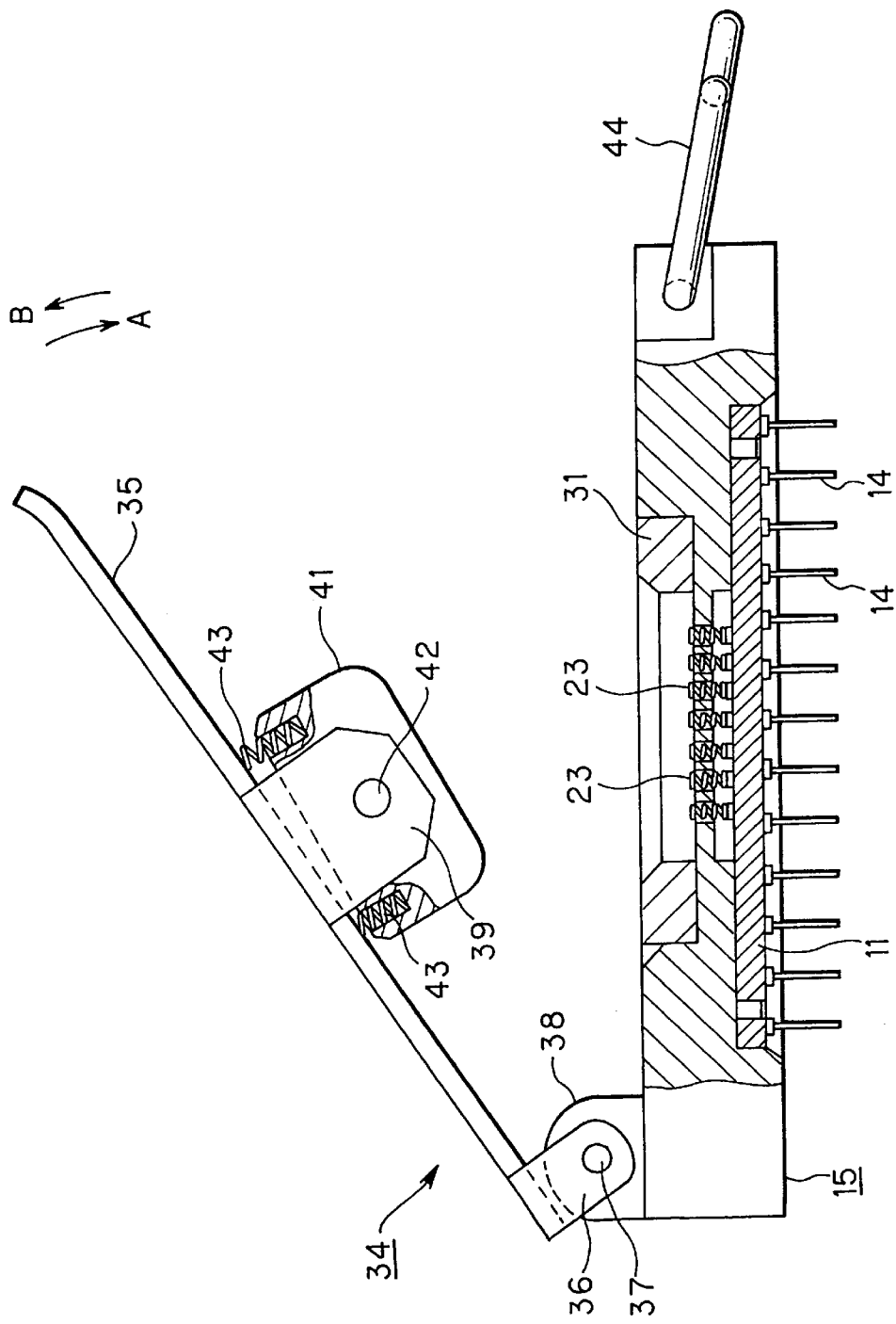
FIG. 8 is a cross-sectional view showing still another typical example of a socket as a prior-art to the socket for the IC according to the present invention.

Referring to FIG. 8, a socket having a suitable IC retention mechanism for burn-in is explained. The socket 34 shown in FIG. 8 is the above-described socket having an IC retention mechanism in addition to the above-described adapter 31.

In this socket 34, a retention plate 35 is rotationally mounted on the base block 15. This retention plate 35 is constituted by a metal sheet on both sides of a terminal end of which a pair of attachment portions 36 are formed by bending. The retention plate 35 has these attachment portions 36 supported by a pivot shaft 37 provided on a bearing 38 provided in turn on one side of the base block 15 so that the retention plate 35 may e rotated about this pivot shaft 37 in the direction indicated by arrows A and B in FIG. 8.

On both sides at a mid portion of the retention plate 35, there are formed a pair of mounting legs 39 by bowing. A retention member 41 is mounted between the mounting legs 39 with a pivot shaft 41. The retention member 41 is formed of synthetic resin substantially as a parallelepiped and is rotationally supported about a pivot shaft 42 as the center of rotation by having the mid portions of the lateral sides thereof supported by the pivot shaft 42. A pair of coil springs 43 are interposed between the retention plate 35 and the retention member 41, with the retention member 41 being rotationally actuated in a see-saw fashion, about the pivot shaft 42 as center, under the bias of the coil springs 43.

Figure 9:
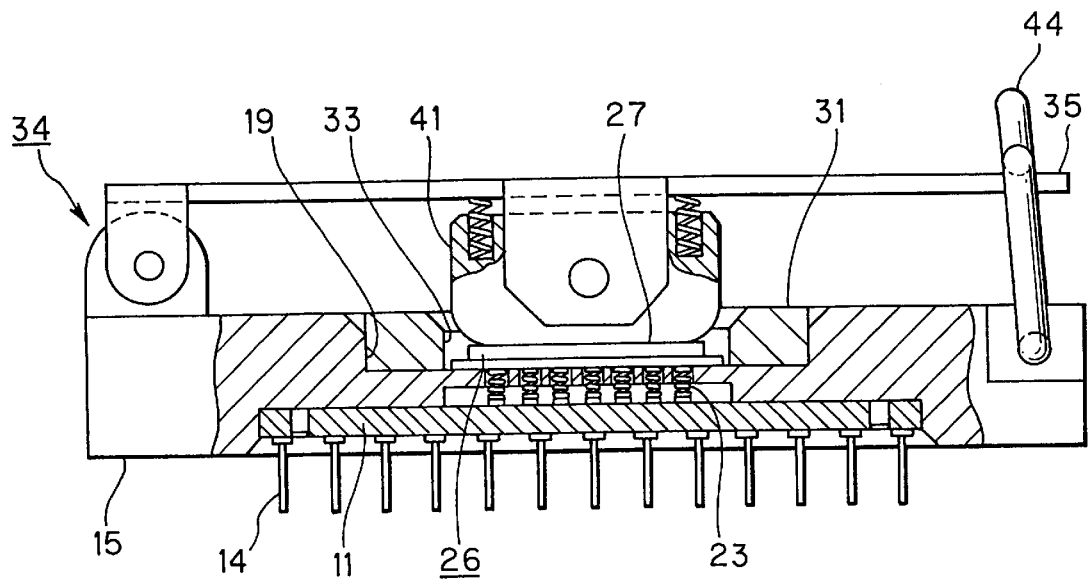
FIG. 9 is a cross-sectional view showing the state in which an IC has been loaded on the socket for the IC shown in FIG. 8.
Figure 10:
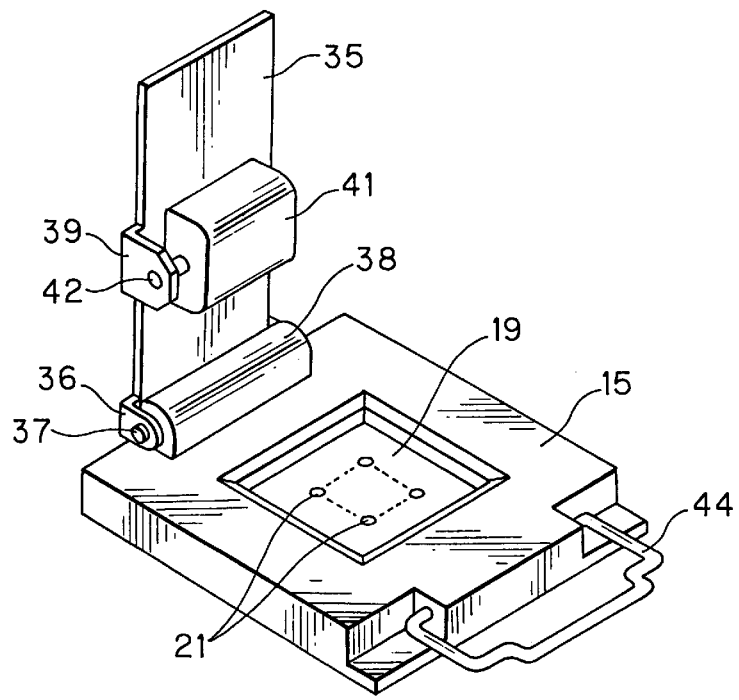
FIG. 10 is a perspective view showing the state in which a retention plate is mounted on a base block constituting the socket for the IC shown in FIG. 8.

In the present socket 34, the IC 26 is pressed against the bottom surface of the second recess 19 by the retention member 41, by closing the retention plate 35 following accommodation of the main body portion of the IC 27 in the IC accommodating hole 33 of the adapter 31, as shown in FIG. 9. The IC 26 is fixedly mounted on the socket 34 by having the rotational end of the retention plate 35 locked by a lock member 44. The lock member 44 is constituted by bowing a rod and has both proximal side ends rotationally fulcrumed by the base block 15, as shown in FIG. 10.

With the above-described IC retention mechanism, the retention member 41 is rotationally displaced about the pivot shaft 42 as center, and is thereby reliably brought into profiling surface contact with the upper surface of the main body portion of the IC 27. Since the main body portion of the IC 27 is pressed with a uniform pressure against the bottom surface of the second recess 19 by the retention member 41 to realize a positive contact state of the bumps 28 provided in the matrix configuration and the coil-shaped contacts 23 with each other. Since the retention member 41 thrusts the upper surface of the main body portion of the IC 27 evenly over a broader surface, there is no risk of destruction of the IC 26 due to partial pressure application. Meanwhile, the coil spring 43 for rotationally biasing the retention member 41 may be omitted, if so desired.

A socket for an IC 66 according to the present invention is hereinafter explained.

Figure 11:
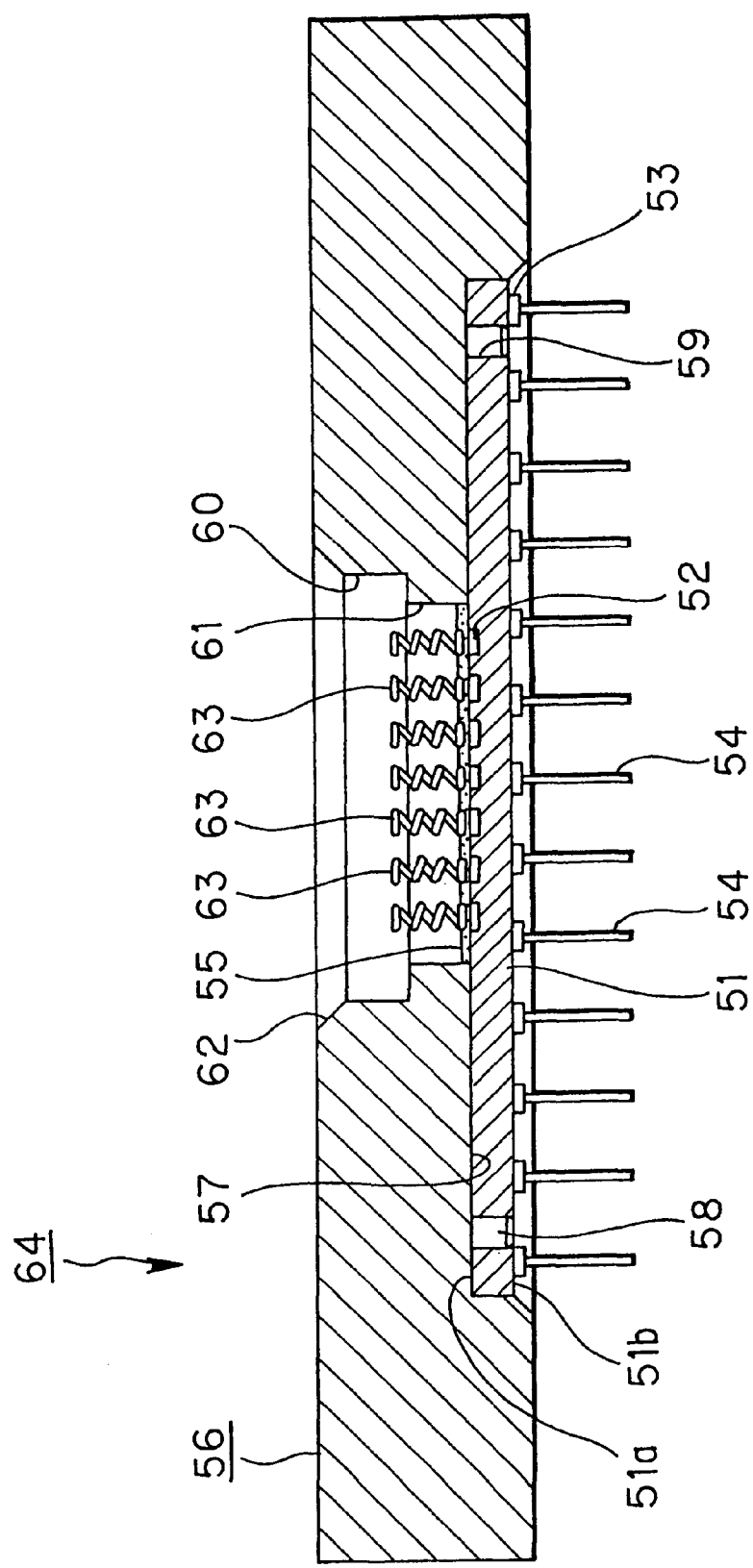
FIG. 11 is a cross-sectional view showing a socket for an IC according to the present invention.
Figure 12:
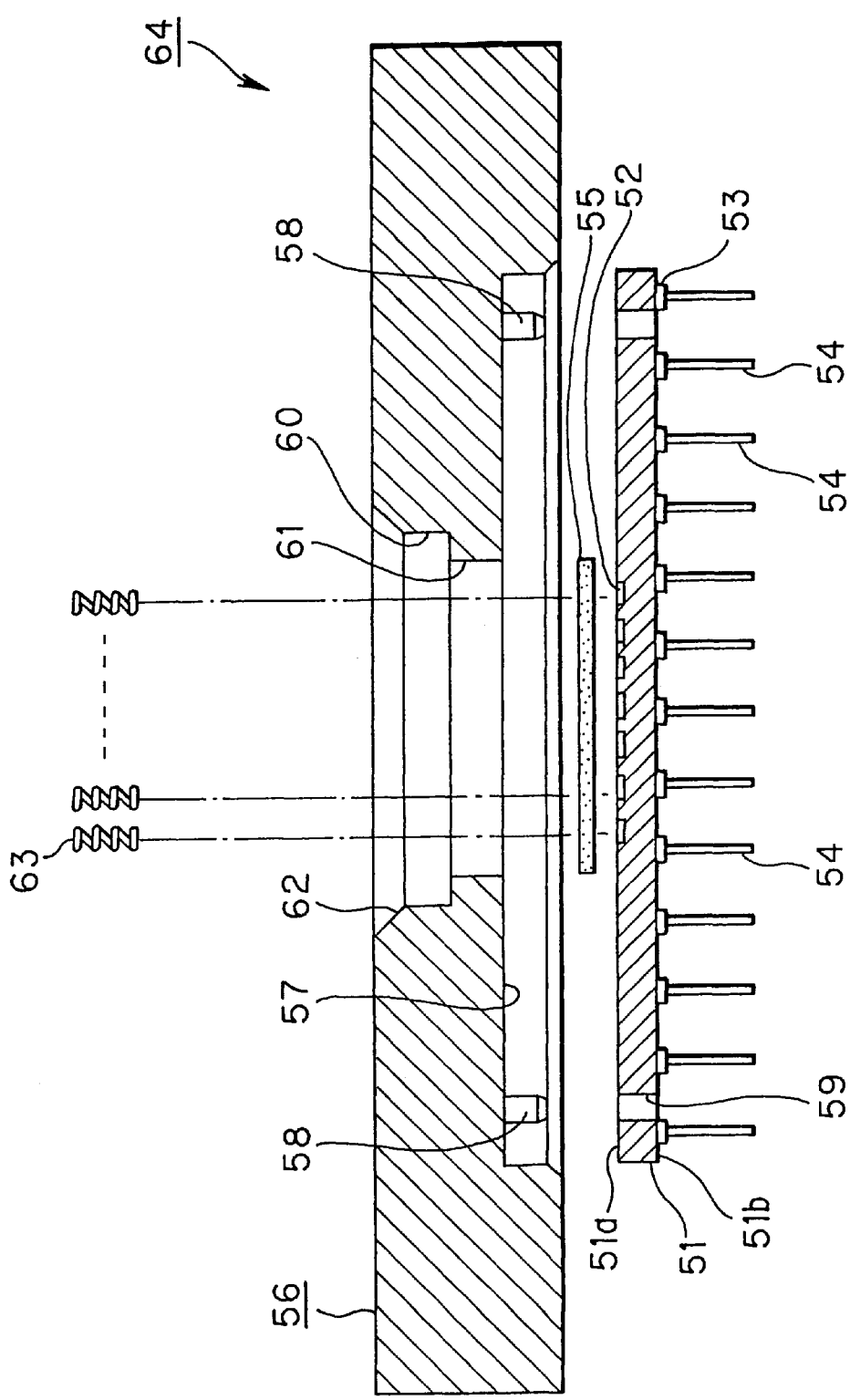
FIG. 12 is a cross-sectional view showing an assembled state of the socket for the IC shown in FIG. 11.
Figure 13:
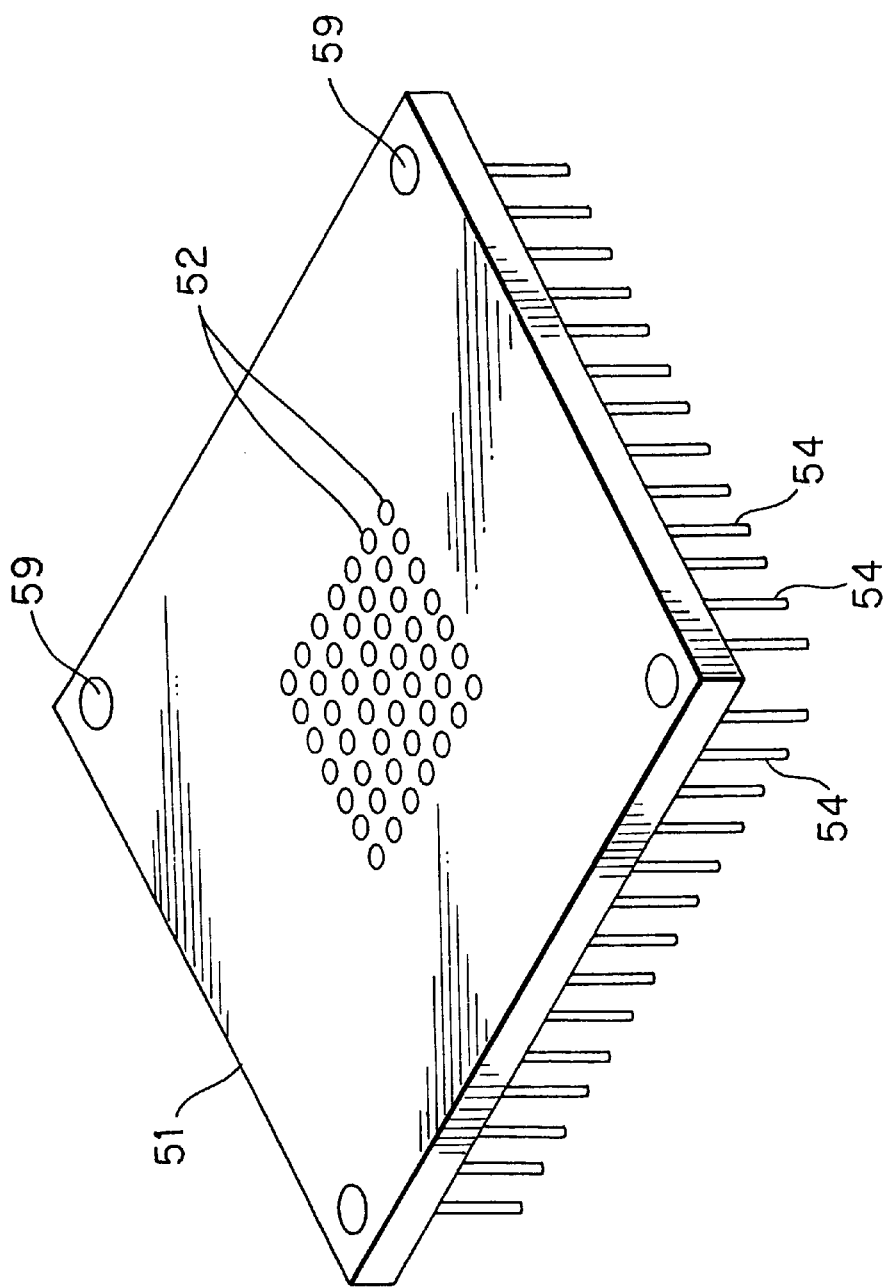
FIG. 13 is a perspective view showing a printed circuit board constituting a socket for an IC according to the present invention.

This socket for an IC 66, configured as shown in FIGS. 11 and 12, includes a printed circuit board 51 of a rectangular contour, as shown in FIG. 13. At a mid portion on one surface 51a of the printed circuit board 51, there are arranged plural contact electrodes 52 in a matrix configuration, as shown in FIG. 13. The arraying pitch and the number of these contact electrodes 52 correspond to those of bumps of an IC loaded on the socket 64. In the embodiment shown in FIG. 13, 7 by 7 contact electrodes 12, totalling at 49, are arranged at a pitch of 0.05 mm.

On the opposite surface 51b of the printed circuit board 51, there are provided plural terminal electrodes 53 electrically connected to the contact electrodes 52 arranged on the surface 51a. These terminal electrodes 53 are formed by multi-layered print wiring technique. The terminal electrodes 53 are enlarged in pitch with respect to the contact electrodes 52 and arranged along the four sides of the printed circuit board 51. The arraying pitch of the respective terminal electrodes 53 is approximately 2.5 mm. In the preferred embodiment, each contact electrode 12 is formed with a through-hole in which is mounted an end of a pin terminal 54. Each pin terminal 54 is electrically connected to the associated terminal electrodes 53.

On a surface 51a of the printed circuit board 51 is arranged an anisotropic electrically conductive adhesive sheet 55 for overlying plural contact electrodes 52 arranged in a matrix configuration, as shown in FIGS. 11 and 12. The anisotropic electrically conductive adhesive sheet 55 is an anisotropic electrically conductive adhesive exhibiting an electrically conductive adhesive action on being thrust and/ or heated, and is constituted by an epoxy adhesive film having micro-sized electrically conductive particles uniformly dispersed therein. This sheet, approximately 50 $\mu$m in thickness, exhibits electrically conductivity only on being thrust and in the thrusting direction.

The socket 64 according to the present invention has a base block 56, formed of synthetic resin, as shown in FIGS. 11 and 12. A first recess 57 of a rectangular profile, for housing the printed circuit board 51 therein, is formed in the lower surface of the base block 56 in FIGS. 11 and 12. This first recess 57 is of a depth slightly deeper than the thickness of the printed circuit board 51 housed therein. At each corner of the first recess 57 is protuberantly formed a connection pin 58. At each corner of the first recess 57 is formed a connection hole 59 into which is inserted the connection pin 58. The printed circuit board 51 is housed in position in the first recess 57 with its surface 51a carrying the connection electrodes 52 facing the base block 51 and with the connection pins 58 introduced into the connection holes 59. The printed circuit board 51 is mounted on the base block 56 by caulking the distal end of the contact electrodes 58 introduced into the connection hole 59.

On the upper surface of the base block 56 opposite to its surface carrying the printed circuit board 51 in FIGS. 11, 12, there is formed a second recess 60 for housing an IC therein. In the bottom surface of the second recess 60 is bored an opening 61 facing the anisotropic electrically conductive adhesive sheet 55 arranged on the printed circuit board 51. The peripheral surface of the opening end of the second recess 60 is flared to form an inclined surface 62 for guiding the insertion of an IC housed in position in the recess 60.

In the opening 61 formed in the base block 56 are arranged coil-shaped contact electrodes 63 side-by-side, as shown in FIGS. 11 and 12. These contact electrodes 63 have respective one ends positioned above the contact electrodes 52 of the printed circuit board 51 via the anisotropic electrically conductive adhesive sheet 55 so as to be in contact with the contact electrodes 52, with the opposite ends of the contact electrodes 63 being slightly protruded into the second recess 60.

The coil-shaped contact electrodes 63 are secured to the anisotropic electrically conductive adhesive sheet 55 by setting a weight on the opposite side to the anisotropic electrically conductive adhesive sheet 55 and by heating and curing the anisotropic electrically conductive adhesive sheet 55 as the pressure is applied from above-mentioned opposite side. The coil-shaped contact electrodes 63, secured to the anisotropic electrically conductive adhesive sheet 55, are electrically connected to the contact electrodes 52 of the printed circuit board 51. That is, the coil-shaped contact electrodes 63 and the contact electrodes of the printed circuit board 51 are mechanically and electrically connected to each other via the anisotropic electrically conductive adhesive sheet 55.

The portions not sandwiched between the anisotropic electrically conductive adhesive sheet 55 and the one ends of the coil-shaped contact electrodes 63 operate as an insulating material.

Figure 14:
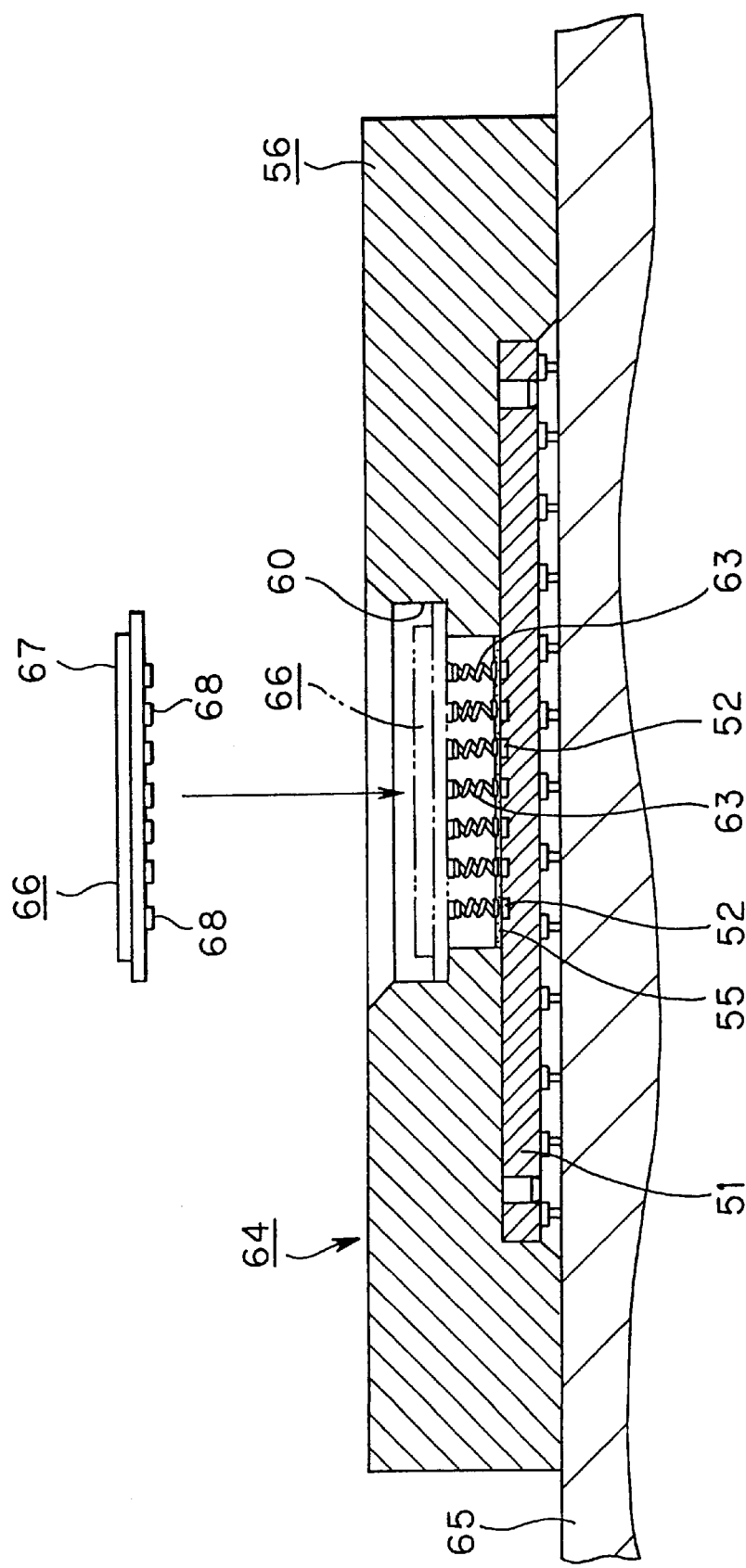
FIG. 14 is a cross-sectional view showing the state of loading an IC on the socket for the IC shown in FIG. 11.
Figure 15:
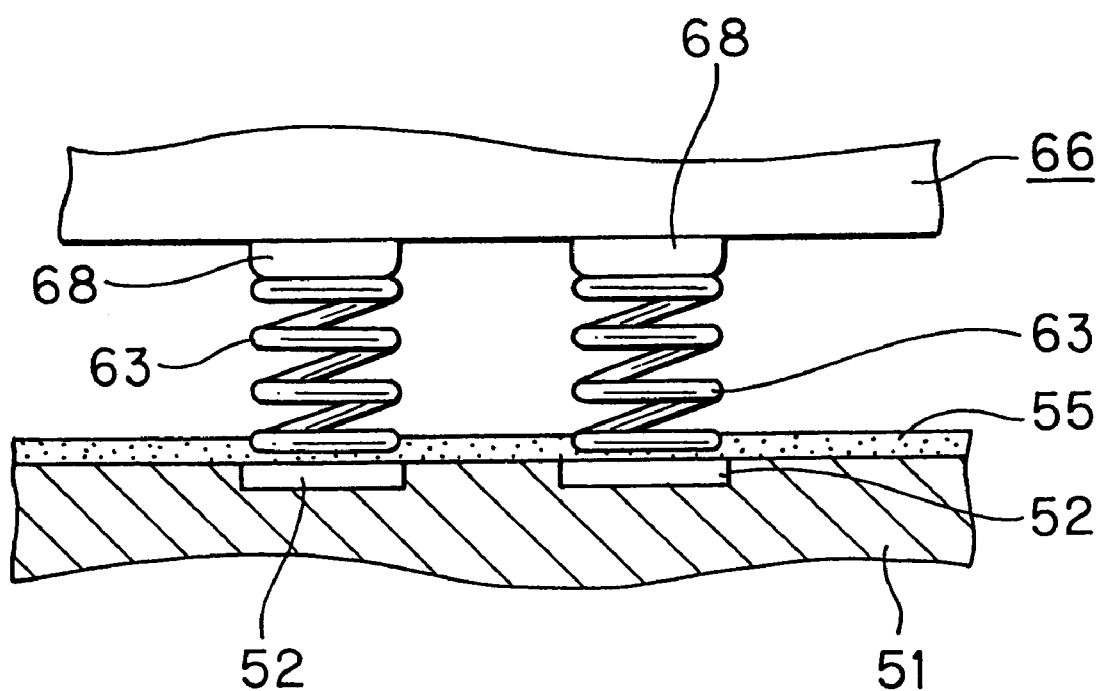
FIG. 15 is an enlarged cross-sectional view showing the contact state between the bumps provided on the IC and coil-shaped contacts.

For inspecting the IC 66 using the above-described socket 64, the socket is mounted on a circuit substrate 65 of a shipment inspection tester, as shown in FIG. 14. If a main body portion of the IC 67 is housed in the second recess 60 of the base block 56, bumps 68 arrayed in a matrix configuration on the lower surface of the main body portion of the IC 67 for operating as external electrodes are positioned on the associated coil-shaped contact electrodes 63. If the upper surface of the main body portion of the IC 27 is thrust by a supporting arm of a robot, for example, the coil-shaped contacts 63 are brought into pressure contact with the bumps 28, as shown in FIG. 15.

With the above-described socket 64, there are constituted contact portions satisfactorily contacted with the narrow-pitch IC bumps by the coil-shaped contact electrodes 63 mounted via the anisotropic electrically conductive adhesive sheet 55 on the contact electrodes 52 provided on the printed circuit board 51, and mounting terminal portions, derived with pitch conversion from the respective contact portions, are constituted by the printed circuit board 51 mounted on the base block 56, so that the socket can be applied to a ball grid array (BGA) or chip size package (CSP) type IC having a matrix array of a large number of narrow pitch bumps to permit facilitated IC inspection.

Figure 16:
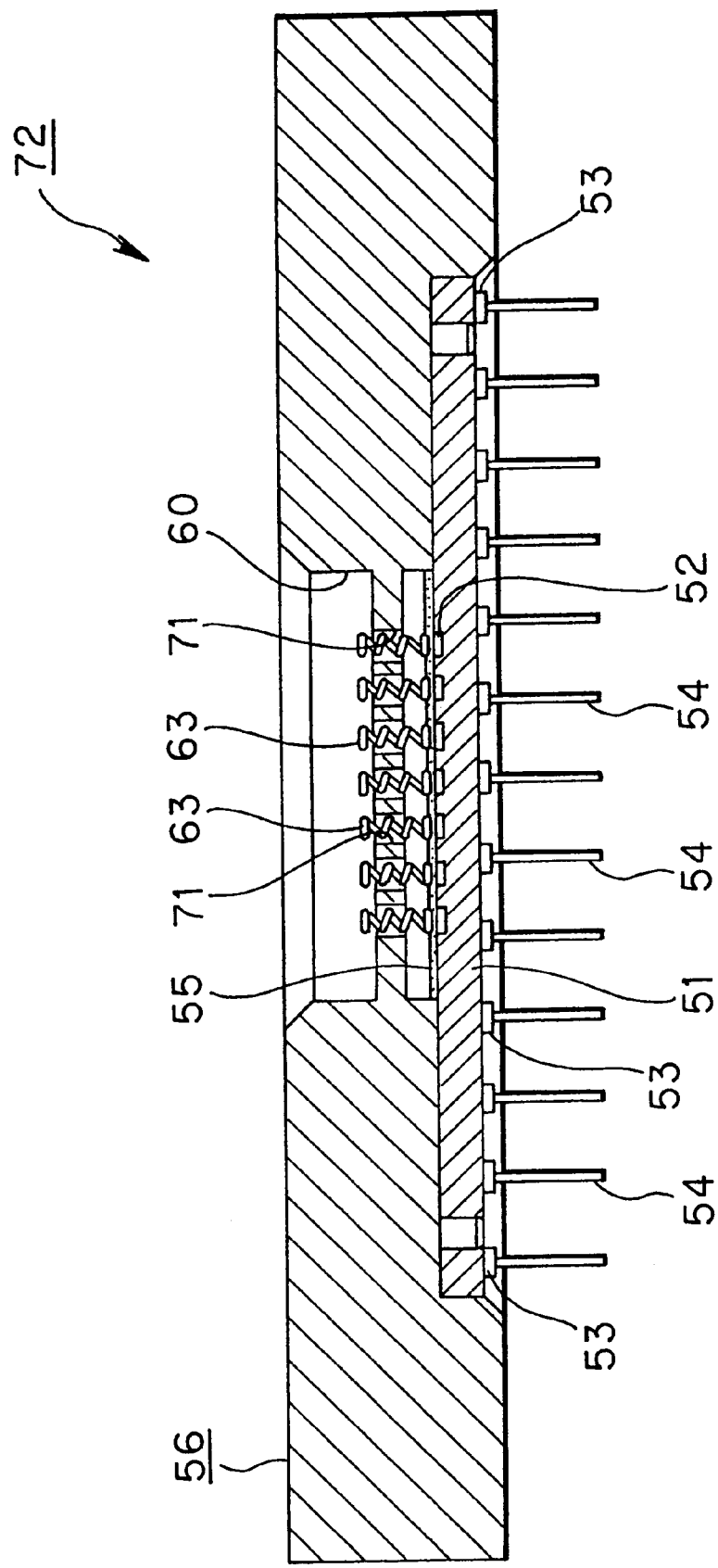
FIG. 16 is a cross-sectional view showing another typical example of a socket for an IC according to the present invention.

The socket 72 of the present invention may also be formed with plural through-holes 71, in place of the opening 61, in the bottom surface of the second recess 60 in the base block 56 for housing the IC 66, as shown in FIG. 16. In this socket, 72, the coil-shaped contact electrodes 63 are respectively introduced into the plural through-holes 71. The coil-shaped contact electrodes 63, thus positioned by the through-holes, are prevented from levelling, thus assuring durability and reliability against repeated use.

Figure 17:
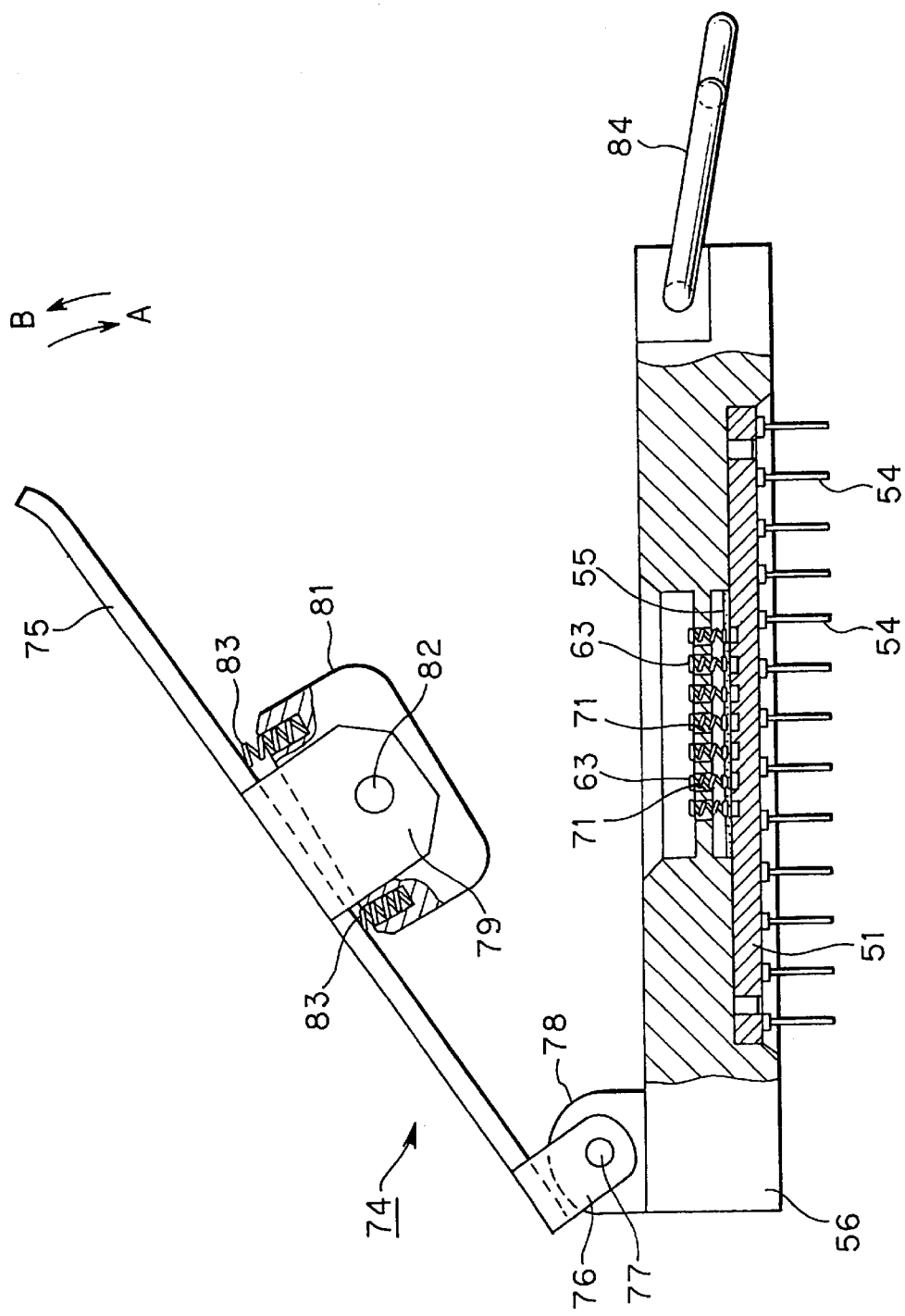
FIG. 17 is a cross-sectional view showing a socket for an IC having a retention plate for the IC.

A socket 74 having an IC retention mechanism suitable for burn-in is now explained with reference to FIG. 17. The socket 74 shown in FIG. 17 corresponds to the socket shown in FIG. 16, that is a socket in which coil-shaped contact electrodes 63 are arranged in the through-holes 71 formed in the bottom surface of the second recess 60 housing the IC 66, and in which there is additionally provided an IC retention mechanism.

In this socket 74, a retention plate 75 is rotationally mounted on the base block 56. This retention plate 75 is constituted by a metal sheet on both sides of a terminal end of which a pair of attachment portions 76 are formed by bowing. The retention plate 75 has these attachment portions 76 supported by a pivot shaft 77 provided on a bearing 78 provided on one side of the base block 56 so that the retention plate 75 may be rotated about this pivot shaft 77 in the direction indicated by arrows A and B in FIG. 17.

On both sides at a mid portion of the retention plate 75, there are formed a pair of mounting legs 79 by bowing. A retention member 81 is mounted between the mounting legs 79 with a pivot shaft 82. The retention member 81 is formed substantially as a parallelepiped and is rotationally supported about a pivot shaft 82 as the center of rotation by having the mid portions of the lateral sides thereof supported by the pivot shaft 82. A pair of coil springs 83 are interposed between the retention plate 75 and the retention member 81, with the retention member 81 being rotationally actuated in a see-saw fashion, about the pivot shaft 82 as center, under the bias of the coil springs 83.

Figure 18:
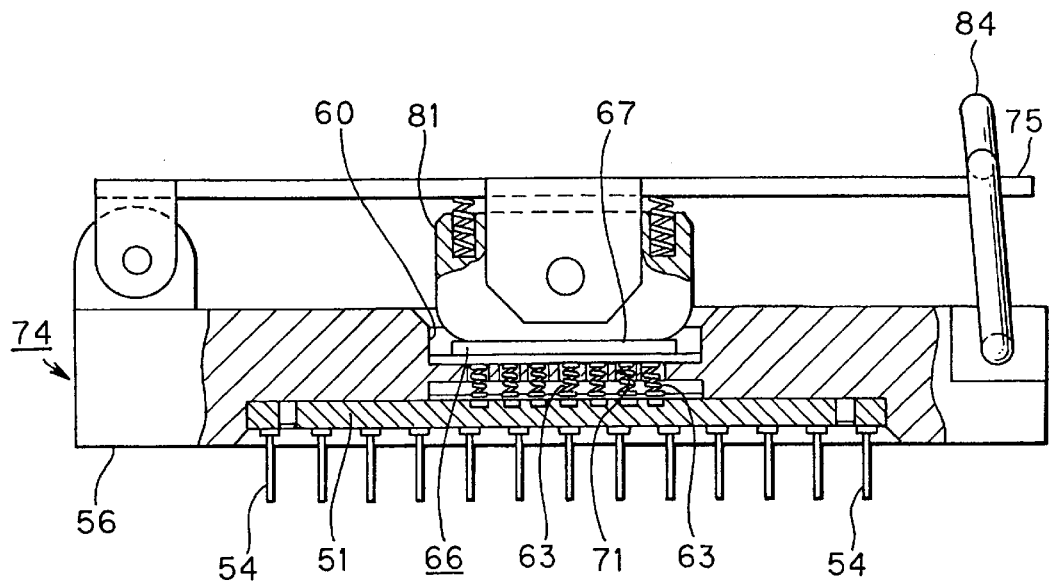
FIG. 18 is a cross-sectional view showing the state in which an IC has been loaded on the socket for the IC shown in FIG. 17.
Figure 19:
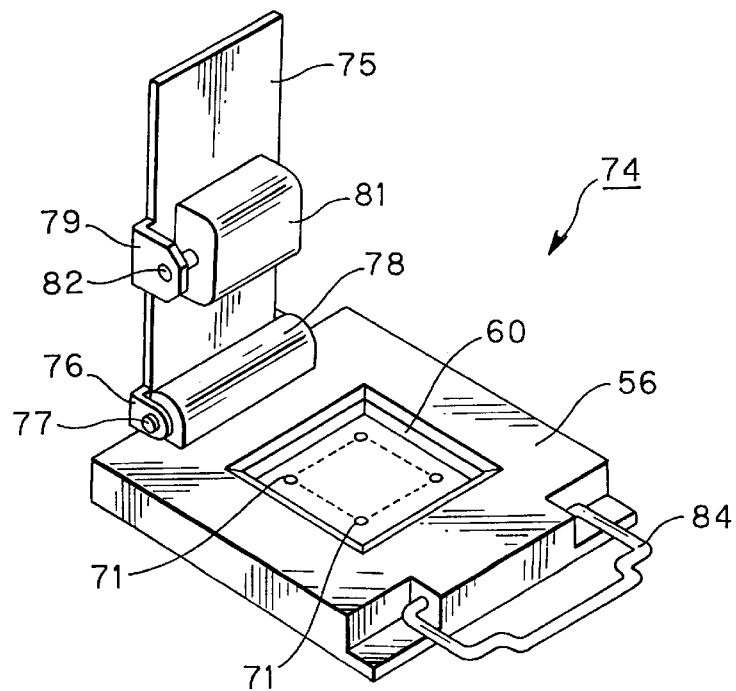
FIG. 19 is a perspective view showing the state in which a retention plate has been mounted on a base block constituting the socket for the IC shown in FIG. 17.

In the present socket 74, the IC 66 is pressed against the bottom surface of the second recess 60 by the retention member 81, by closing the retention plate 75 following accommodation of the main body portion of the IC 67 in the second recess 60, as shown in FIG. 18. The IC 66 is fixedly mounted on the socket 74 by having the rotational end of the retention plate 75 locked by a lock member 84. The lock member 84 is constituted by bowing a rod and has both proximal side ends rotationally fulcrumed by the base block 56, as shown in FIG. 19.

With the above-described IC retention mechanism, the retention member 81 is rotationally displaced about the pivot shaft 82 as center, and is thereby reliably brought into profiling surface contact with the upper surface of the main body portion of the IC 67. Since the main body portion of the IC 67 is pressed with a uniform pressure against the bottom surface of the second recess 60 by the retention member 81 to realize positive contact state of the bumps 68 provided in the matrix configuration and the coil-shaped contacts 63 with each other. Since the retention member 41 thrusts the upper surface of the main body portion of the IC 67 evenly over a broader surface, there is no risk of destruction of the IC 66 due to partial pressure application. Meanwhile, the coil spring 83 for rotationally biasing the retention member 81 may be omitted, if so desired.

Figure 20:
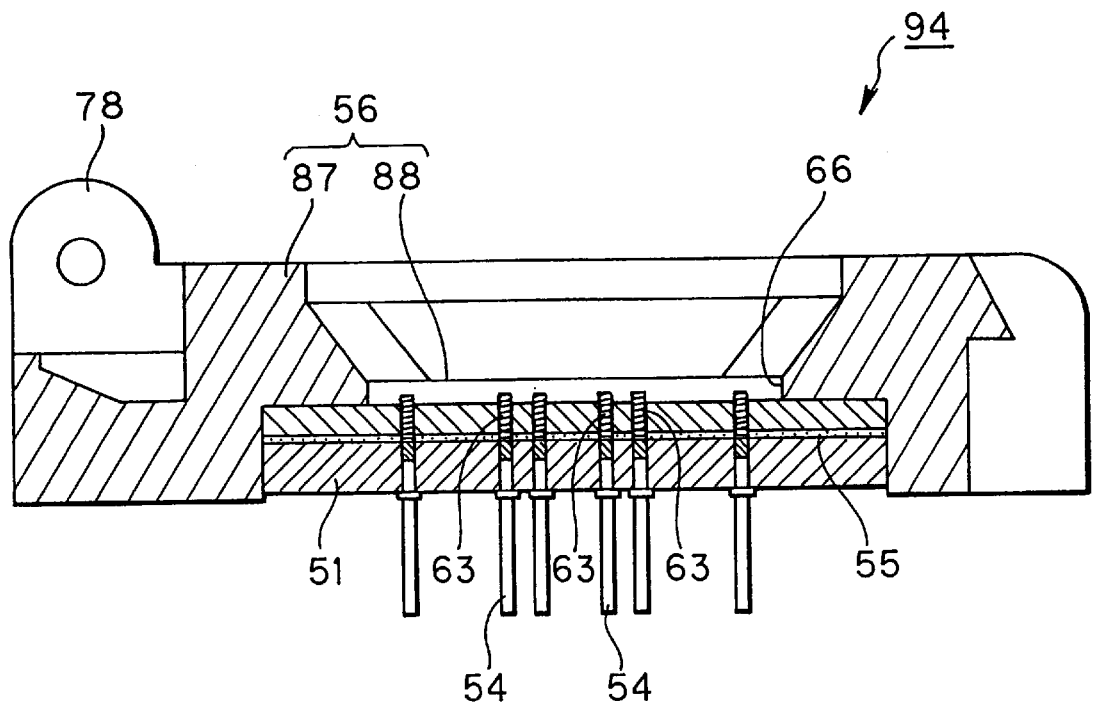
FIG. 20 is a cross-sectional view showing an example of a socket for an IC in which contacts and terminals are provided at the same pitch on the printed circuit board.
Figure 21:
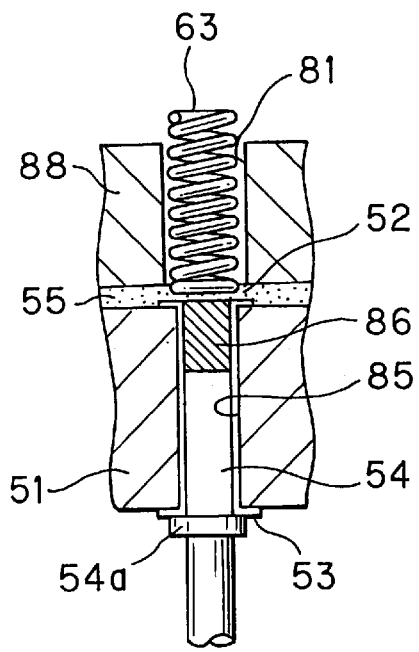
FIG. 21 is a cross-sectional view showing essential portions of the socket for the IC shown in FIG. 20.

With the above-described sockets 64, 74 according to the present invention, the arraying pitch of the terminal electrodes 53 provided on the printed circuit board 51 is enlarged in comparison with that of the terminal electrodes 53 provided on the printed circuit board 51. Alternatively, the arraying pitch of the terminal electrodes 53 may be set so as to be equal to that of the contact electrodes 52, as shown in FIG. 20. A socket 94, shown in this figure, has a printed circuit board 51 formed with plural through-holes 85, as shown in FIG. 21, with contact electrodes 52 and terminal electrodes 53 being provided on the rims of both opening sides of these through-holes 85. In each through-hole 85 is mounted a pin terminal 54 by having its one end inserted therein. Each pin terminal 54 is secured by a solder 86 charged into the through-hole 85 and is electrically connected to the contact electrodes 52. Each terminal pin 54 is electrically connected to the terminal electrodes 53 by contacting a flange 54*a* formed on its proximal side with the terminal electrodes 53, as shown in FIG. 21.

The coil-shaped contact electrodes 63, used in the socket 94, shown in FIGS. 20 and 21, are inserted and positioned in a through-hole 71, as in the case of the socket 72 shown in FIG. 16.

Meanwhile, the base block 56 of the socket 94 is constituted by a main body portion of the base block 87 and a guide plate or an adapter 88, which is formed with a through-hole 81 in which the coil-shaped contact electrode 63 is to be arranged, as shown in FIG. 20.

In the above-described embodiment, the anisotropic electrically conductive adhesive sheet 55 is used as an anisotropic electrically conductive adhesive for mechanically and electrically connecting the contact electrodes 52 and the coil-shaped contact electrodes 63. This, however, is merely illustrative, and a paste-like anisotropic electrically conductive paint may be used. The anisotropic electrically conductive paint may be applied by e.g., printing means on the printed circuit board 51.

Figure 22:
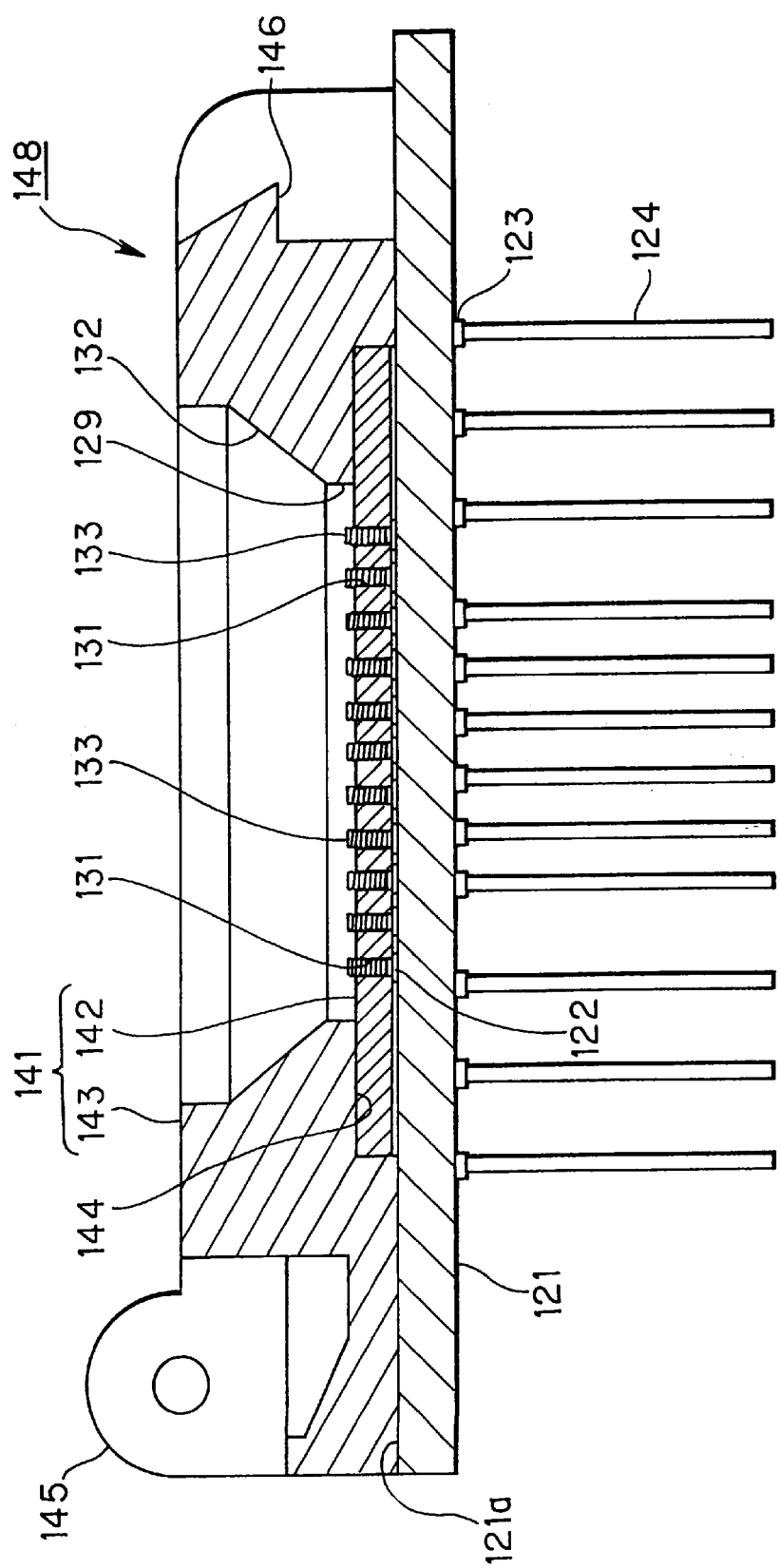
FIG. 22 is a cross-sectional view showing another typical example of a socket for an IC according to the present invention.

Another embodiment of a socket for an IC is explained. In this socket for an IC 148, a base block 141, arranged on one surface 121*a* of the printed circuit board 121, is constituted by a guide plate or an adapter 142 and a frame 143, a first recess 144 is formed in the surface of the frame 143 carrying the printed circuit board 121 and the guide plate 142 is housed in the first recess 144, as shown in FIG. 22.

The guide plate 142 is formed with plural through-holes 131 in register with contact electrodes 122 provided in a matrix configuration on a surface 121*a* of the printed circuit board 121. The portion 143 of the frame 143 facing the through-holes 131 bored in the guide plate 142 is provided with an opening. This opening and a surface of the guide plate 142 facing this opening define a second recess 129 in which an IC loaded on this socket 148 is housed in position. The peripheral surface of the opening side end of the second recess 129 is flared to form an inclined surface 132 for guiding the insertion of an IC housed in the second recess 129.

On a bearing 145 provided on one end of the frame 143 is rotationally mounted a cover, not shown, adapted for opening and closing the second recess 129. On the opposite side of the frame 143 with respect to the side thereof provided with the bearing 145 is formed an engagement lug 146 engaged with a portion of the cover rotated to a position of closing the second recess 129. The cover is locked at a position of closing the second recess 129 by being engaged with the engagement lug 146.

The base block 141 made up of the guide plate 142 and the frame 143 is fixedly coupled to the printed circuit board 121 by e.g., a caulking pin, not shown.

Figure 23:
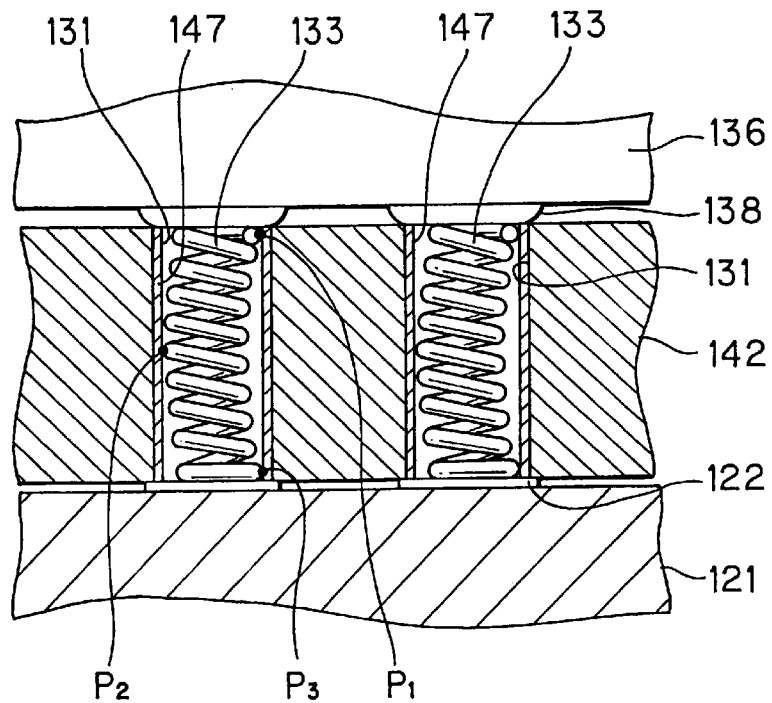
FIG. 23 is a partial cross-sectional view showing the state in which an IC has been loaded on the socket for the IC shown in FIG. 22.

On the inner peripheral surface of each through-hole 131 bored in the guide plate 142 is formed an electrically conductive film 147, as shown in FIG. 23. In the through-holes 131, thus provided with the electrically conductive films 147, there are arranged coil-shaped contacts 133, one ends of which are positioned on and contacted with contact electrodes 122 of the printed circuit board 121 and the opposite ends of which are slightly protruded from the one surface of the guide plate 142, that is the bottom surface of the second recess 129, and introduced into the through-holes 131.

The electrically conductive film 147, formed on the inner peripheral surface of the through-hole 131, is formed by e.g., Cu plating, and is preferably of a three-layered plating structure made up of a Cu plating, an underlying Ni plating and an Au plating, in this order.

When an IC 136 is loaded in position in the second recess 129, the coil-shaped contacts 133 are thrust and compressed by the bumps 138 provided on the lower sides of the IC 136. The coil-shaped contacts 133 are compressed against the bumps 138 by the elastic recoiling force produced by compression by the bumps 138. The coil-shaped contacts 133 are pressed against the bumps 138 under the elastic recoiling force produced by compression by the bumps and are thereby positively contacted with the bumps 138. When compressed by the bumps 138, the coil-shaped contacts 133 are deformed in the through-holes 131 by being distorted from an upstanding position and are thereby brought into partial pressure contact with the electrically conductive film 147 formed on the inner peripheral surfaces of the through-holes 131. At this time, the coil-shaped contact 133 is contacted with the electrically conductive film 147 at three positions of P1, P2 and P3. In this case, shorting occurs across the points P1 and P3 by the electrically conductive film 147, such that the portion of the electrically conductive film 147 between these points P1 and P3 and the coil-shaped contact 133 operate as a connection conductor between the bumps 138 and the contact electrodes 122. The result is that the connection resistance between the bump 138 and the contact electrode 122 is significantly reduced to e.g., $0.05\Omega$ which is on the order of one-tenth of the connection resistance of the socket in which the coil-shaped contact 133 is simply inserted into a through-hole not provided with an electrically conductive film. Moreover, the inductance is lowered to improve the electrically properties of the socket significantly.

Figure 24:
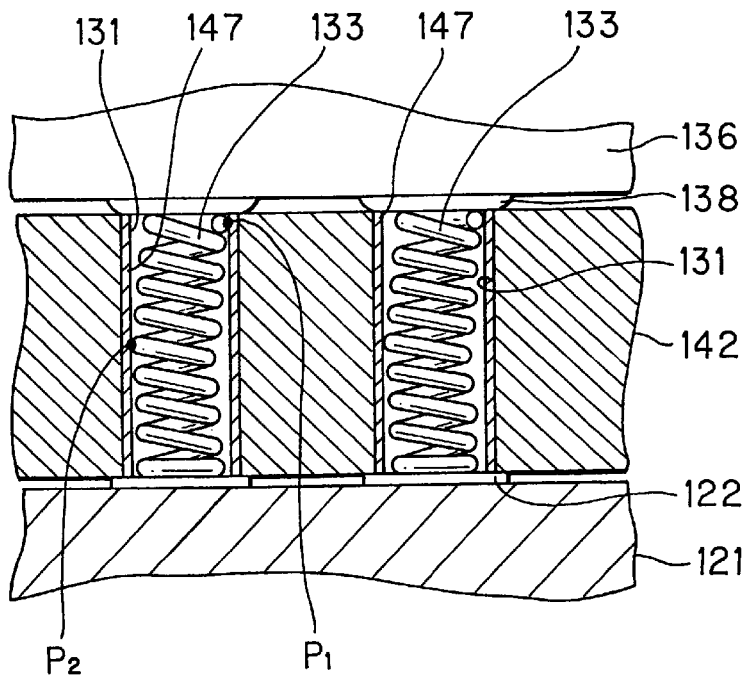
FIG. 24 is a partial cross-sectional view showing another example of the state in which an IC has been loaded on the socket for the IC shown in FIG. 22.
Figure 25:
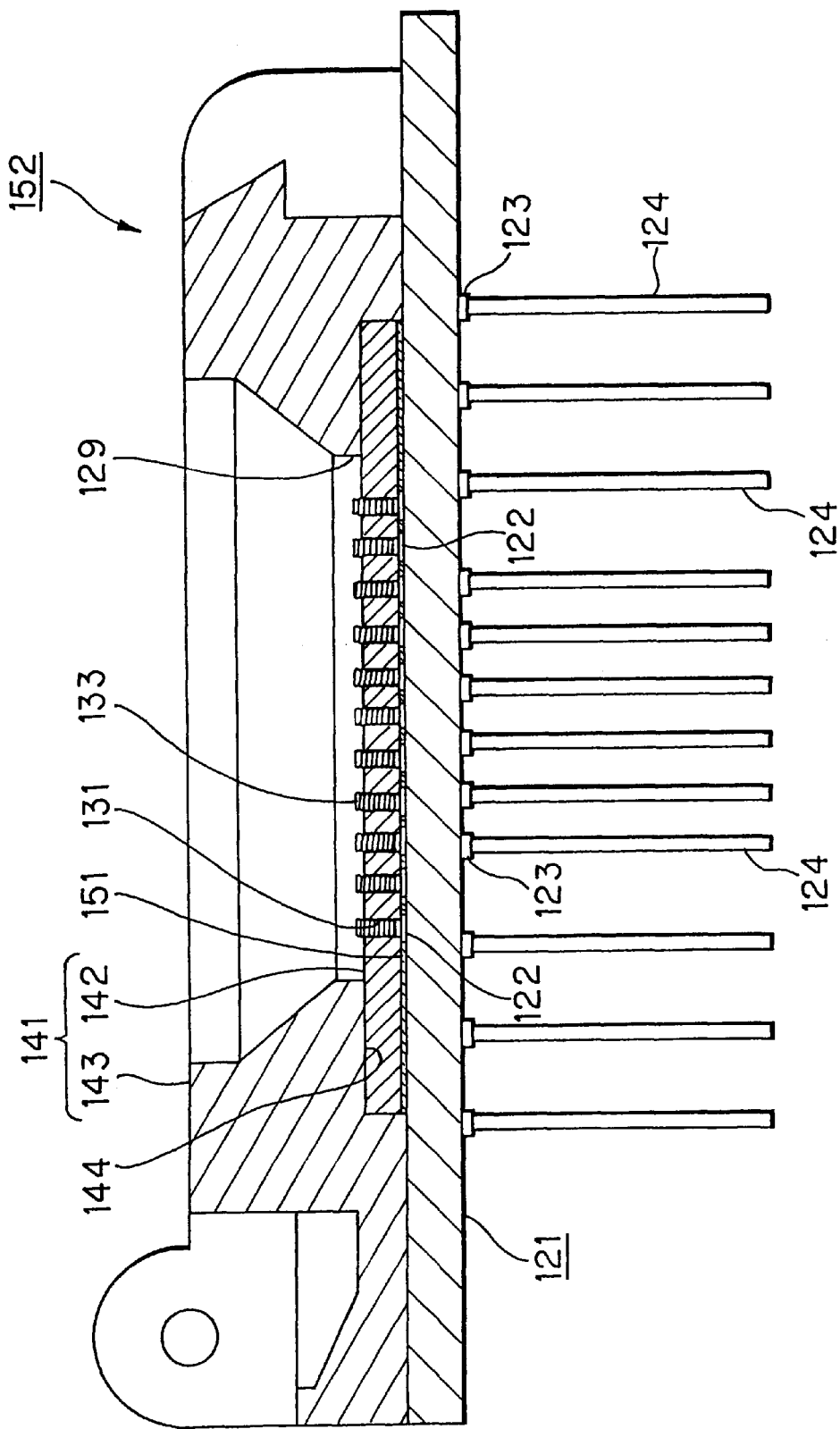
FIG. 25 is a cross-sectional view showing still another typical example of a socket for an IC according to the present invention.
Figure 26:
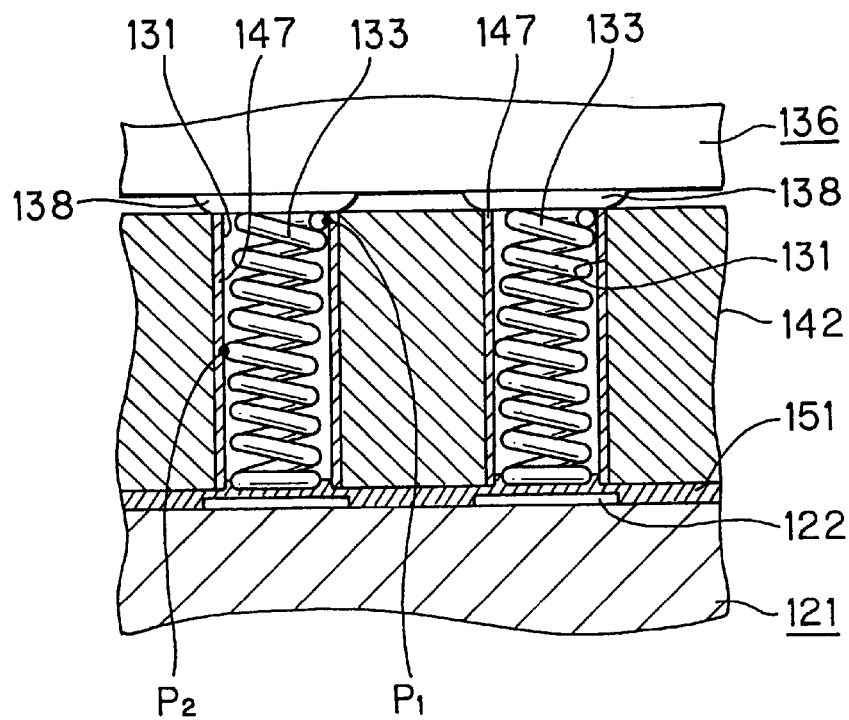
FIG. 26 is a partial cross-sectional view showing the state in which an IC has been loaded on the socket for the IC shown in FIG. 25.

When compressed by the bumps 138, the coil-shaped contact 133 can be compressed in an ideal state without its axis being bent from a true vertical. In actuality, the coil-shaped contact 133 may have its axis bent during compression by such factors as the shape, size or the accuracy of the line bump 138 or the coil-shaped contact 133. At this time, the coil-shaped contact 133 may be contacted at two points of P1 and P2, as shown in FIG. 24, in distinction from the state shown in FIG. 23. In this case, the portion between the points P1 and P2 of the electrically conductive film 147 operates as a connection conductor. For achieving bowing of the coil-shaped contact 133 and an optimum pressure contacting state of the coil-shaped contact 133 with the electrically conductive film 147, the winding pitch of the coil-shaped contact 133 as dense as possible is preferred.

A still further embodiment of a socket for IC 152 according to the present invention is hereinafter explained.

With this socket for an IC 152, electrical connection between the contact electrode 122 and the coil-shaped contact 133 is achieved by an anisotropic electrically conductive adhesive sheet 151. The portions common to those of the socket 148 shown in FIG. 22 are depicted by the same reference numerals and detailed explanation is not made for simplicity.

In the preferred embodiment, an anisotropic electrically conductive adhesive sheet 151 is provided between the printed circuit board 121 and the guide plate 142 of the base block 141.

The anisotropic electrically conductive adhesive sheet 151 is an epoxy adhesive film having micro-sized electrically conductive particles uniformly dispersed therein, and optimum electrically conductivity is produced only in the compressed portion in the direction of compression. The thickness of the anisotropic electrically conductive adhesive sheet 151 is preferably on the order of 50 µm.

In the present preferred embodiment, the contact electrode 122 and the coil-shaped contact 133 face each other with the anisotropic electrically conductive adhesive sheet 151 in-between. By heating and curing the anisotropic electrically conductive adhesive sheet 151 with each coil-shaped contact 133 compressing against the anisotropic electrically conductive adhesive sheet 151, the contact electrode 122 and the coil-shaped contact 133 facing each other can be mechanically and electrically connected in their entirety via the anisotropic electrically conductive adhesive sheet 151. Therefore, in the present preferred embodiment, there is no risk of each coil-shaped contact 133 becoming detached from the through-hole 131, with the coil-shaped contact 133 being reliably held in the through-hole 131. The guide plate 142 itself also is bonded to the printed circuit board 121 by this anisotropic electrically conductive adhesive sheet 151.

If the IC 136 is loaded in position in the second recess 129 of the socket for an IC 152, the coil-shaped contact 133 is thrust and compressed by the bump 138 provided on the lower surface of the IC 136. The coil-shaped contact 133 is compressed against the bump 138 under the elastic recoiling force stored on compression by the bump 138 so as to be thereby reliably contacted with the bump 138. When compressed by the bump 138, the coil-shaped contact 133 is deformed and bowed from a true upstanding position in the through-hole 131 so that it is partially contacted under pressure at two points of P1 and P2 with the electrically conductive film 147 formed on the inner peripheral surface of the through-hole 131. The result is that the connection resistance value is decreased in an amount corresponding to the shorting by the portion of the electrically conductive film 147 between the points P1 and P2.

Figure 27:
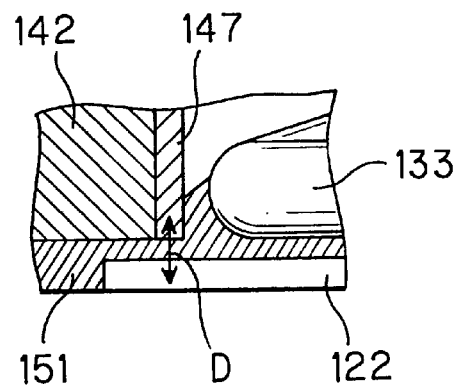
FIG. 27 is a partial cross-sectional view showing the state in which an electrically conductive film provided on the inner periphery of a through-hole in which to mount a coil-shaped contact and an anisotropic electrically conductive adhesive sheet are electrically connected to each other.

If a required pressure is applied against the guide plate 142 at the time of heating and curing of the anisotropic electrically conductive adhesive sheet 151, so that the contact electrode 122 facing the electrically conductive film 147 via the anisotropic electrically conductive adhesive sheet 151 and the portion indicated by arrow D in FIG. 27 are directly electrically connected to each other without the interposition of the coil-shaped contact 133, as shown in FIG. 27, shorting occurs across the point P1 and the contact electrode 122 by the electrically conductive film 147 and the anisotropic electrically conductive adhesive sheet 151, for further reducing the resistance. This effect is achieved if the coil-shaped contact 133 and the electrically conductive film 147 are contacted with each other only at a sole point P1.

Figure 28:
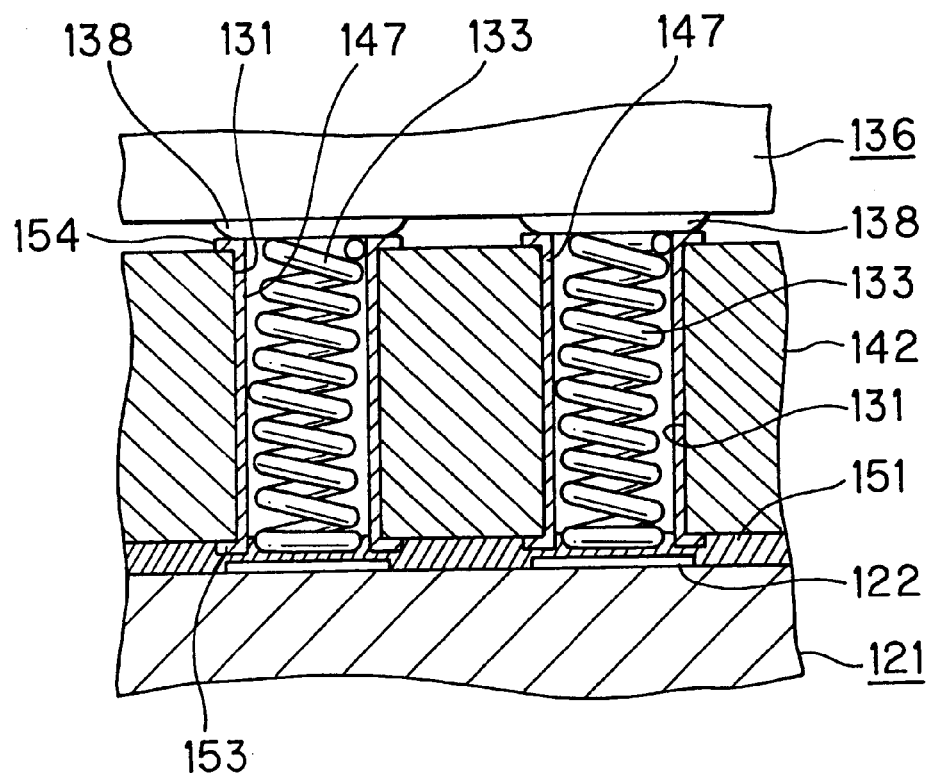
FIG. 28 is a cross-sectional view showing another example of the electrically conductive film provided on the inner periphery of the through-hole.
Figure 29:
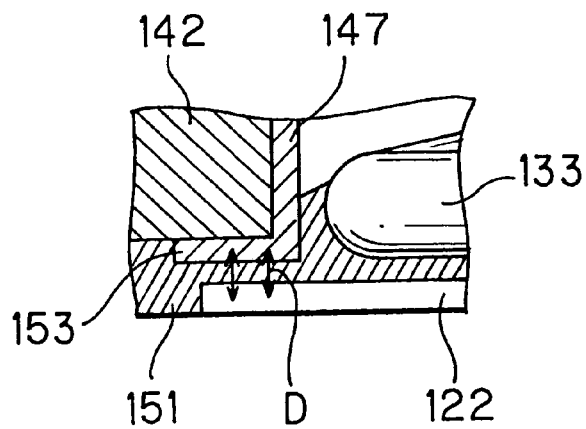
FIG. 29 is a partial cross-sectional view showing the state in which an electrically conductive film provided on the inner periphery of a through-hole in which to mount a coil-shaped contact and an anisotropic electrically conductive adhesive sheet are electrically connected to each other.

FIG. 28 shows an example in which an electrode film 153 is formed around the rim of the opening end of the through-hole 131 towards the printed circuit board 121 for assuring stable and positive electrical connection between the electrically conductive film 147 and the contact electrode 122 by the anisotropic electrically conductive adhesive sheet 151. FIG. 29 shows a portion of FIG. 28 to an enlarged scale. The electrode film 153 is constituted by, for example, Cu plating, and is unified to the electrically conductive film 147. In the preferred embodiment, the electrically conductive film 154 is provided on the rim of the opening end side of the through-hole 131 to which is loaded the IC 136. By constituting the electrically conductive film 147 having the electrode film 153 in this manner, it is possible to enlarge the contact portion between the electrically conductive film 147 and the anisotropic electrically conductive adhesive sheet 151, as indicated by arrow D in FIG. 29.

Figure 30:
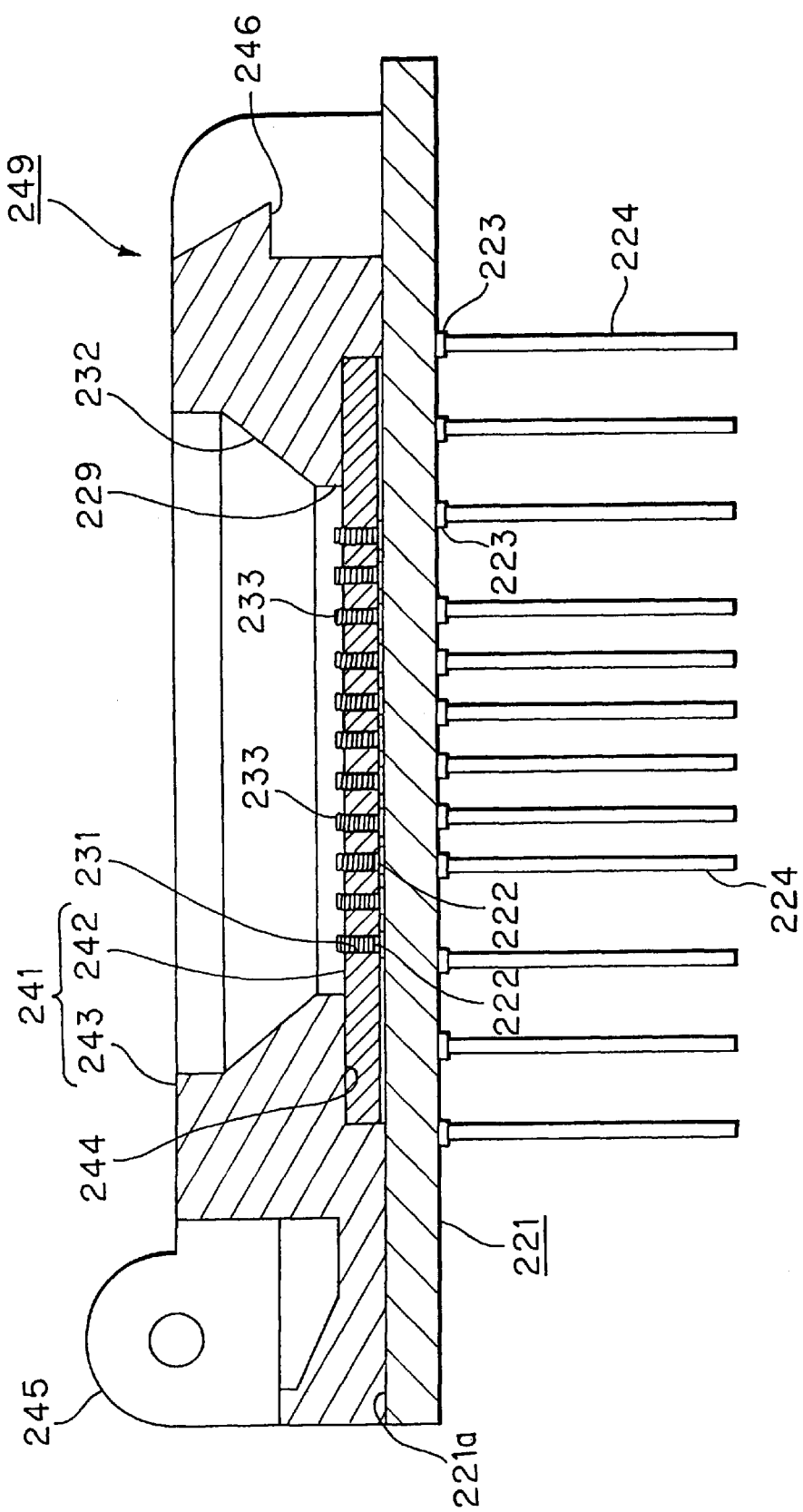
FIG. 30 is a cross-sectional view showing a further typical example of a socket for an IC according to the present invention.

A further example of the socket for an IC according to the present invention is hereinafter explained. In this socket for an IC 249, a base block 241 arranged on one surface 221a of a printed circuit board 221 is constituted by a guide plate 242 and a frame 243, and a surface of the frame 243 carrying the printed circuit board 221 is formed with a first recess 244, within which is housed the guide plate 242, as shown in FIG. 30.

In the guide plate 242, there are formed plural through-holes 231 in register with contact electrodes 222 arranged in a matrix configuration on the surface 221a of the printed circuit board 221. The portion of the frame 243 in register with the through-holes 231 bored in the guide plate 242 is formed with an opening which, in conjunction with a surface of the guide plate 242 facing the opening, delimits a second recess 229 for housing the IC loaded on this socket 249 in position therein. The peripheral surface on the opening side of the second recess 229 is flared to form an inclined surface 232 for guiding the insertion of an IC housed in the second recess 229.

On a bearing 245 provided at one end of the frame 243 is rotatably mounted a cover for opening/closing the second recess 229. The end of the frame 243 opposite to the bearing 245 is formed with a engagement lug 246 engaged by a portion of the cover rotated to the position of closing the second recess 229. The cover is locked, on engagement with the engagement lug 246, at a position of closing the second recess 229.

The base block 241, made up of the guide plate 242 and the frame 243, and the printed circuit board 221, are fixedly connected to each other by a caulking pin etc, not shown.

Figure 31:
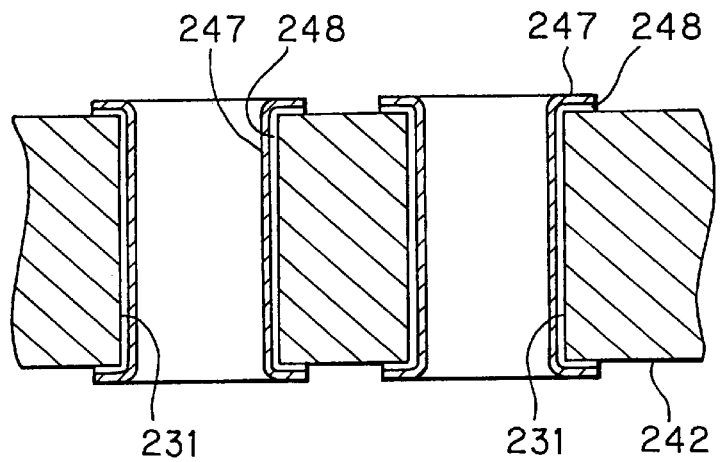
FIG. 31 is a cross-sectional view showing a through-hole formed in the printed circuit board constituting the socket for the IC shown in FIG. 30.
Figure 32:
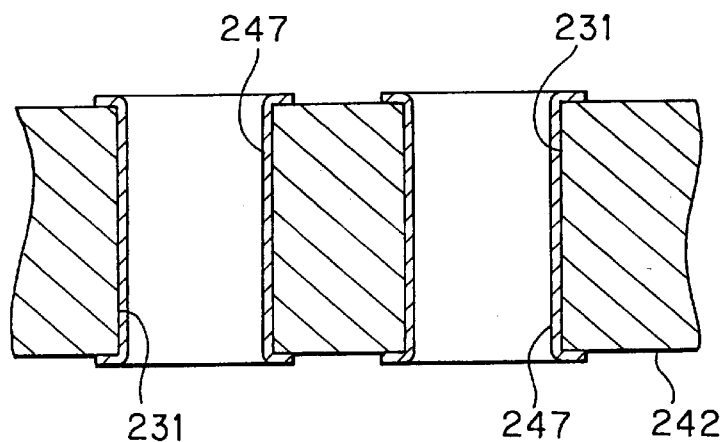
FIG. 32 is a cross-sectional view showing another example of a through-hole formed in the printed circuit board.
Figure 33:
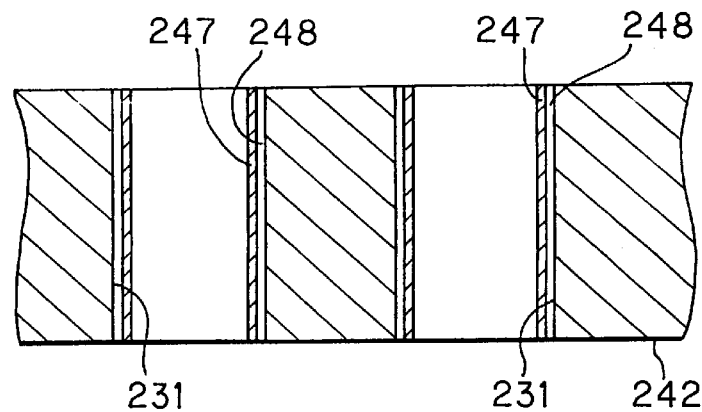
FIG. 33 is a cross-sectional view showing still another example of a through-hole formed in the printed circuit board.
Figure 34:
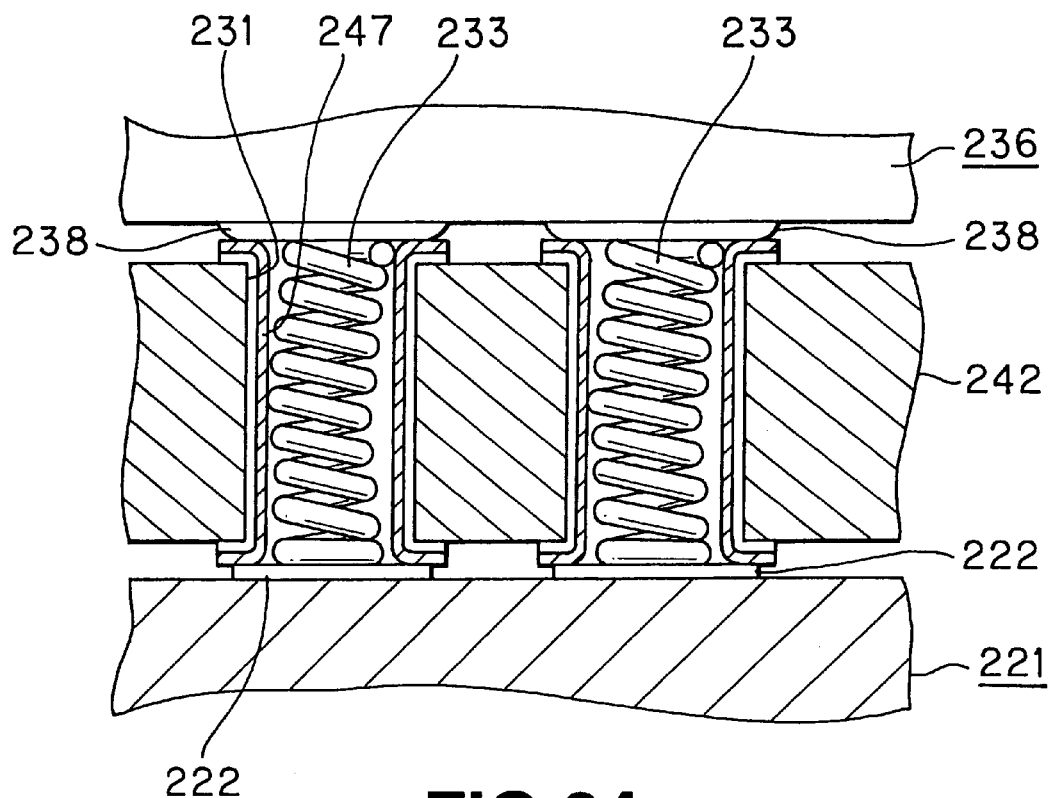
FIG. 34 is a cross-sectional showing the state of loading of an IC on the socket for the IC shown in FIG. 30.

On the inner peripheral surface of each through-hole 231, bored in the guide plate 242, there is formed a magnetic film 247, as shown in FIG. 31. In each through-hole 231, carrying the magnetic film 247, there is introduced a coil-shaped contact 233 which has its one end positioned on and contacted with the contact electrode 222 of the printed circuit board 221, and which has its opposite end slightly protruded from the surface of the guide plate 242, that is from the bottom of the second recess 229, into the through-hole 231.

The magnetic film 247 is formed of, for example, Permalloy, and is formed on the inner peripheral surface of each through-hole 231 by the following steps:

(i) First, on the inner peripheral surface and on the rim of both opening ends of the through-hole 231, an underlying Cu film 248 is formed by electroless plating, as shown in FIG. 31;

(ii) then, a paint produced by dissolving fine Permalloy powders in a polyhydric alcohol based solvent to form a paste is printed at the positions of one surface of the guide plate 242 in register with the through-holes 131;

(iii) this paint is sucked under vacuum from the lower sides of the through-holes 231 facing the side of the guide plate 242 opposite to the paint printed surface to form a coating film on the inner peripheral surface of the through-hole 231, that is on the underlying coating film 248; and (iv) the coating film is fired at elevated temperature under a condition e.g., of 125° C. for three hours and cured. This forms a Permalloy magnetic film 247 on the underlying coating film 248.

In the above method, the magnetic film 247 is formed after forming the underlying Cu film 248. However, the underlying Cu film 248 may be omitted and the magnetic film 247 may directly be formed on the inner peripheral surface of the through-hole 231. In this case, the magnetic film 247 may be somewhat inferior in film thickness fluctuations or strength in comparison with the magnetic film provided with the underlying Cu film 248.

The magnetic film 247 may also be provided only on the inner peripheral surface of the through-hole 231. This magnetic film 247 may also be formed by, for example, plating, instead of by the above method.

If the IC 236 is loaded in position in the second recess 229 of the socket for an IC 249, the coil-shaped contact 233 is thrust and compressed by the bump 238 provided on the lower surface of the IC 236. The coil-shaped contact 233 is reliably contacted with the bump 238 by compression against the bump 238 under the elastic recoiling force produced by compression by the bump 238. At this time, each coil-shaped contact 233 is surrounded and magnetically shielded by the magnetic film 247 formed on the inner peripheral surface of the through-hole 231, thus significantly reducing the cross-talk with the coil-shaped contact 233.

Figure 35:
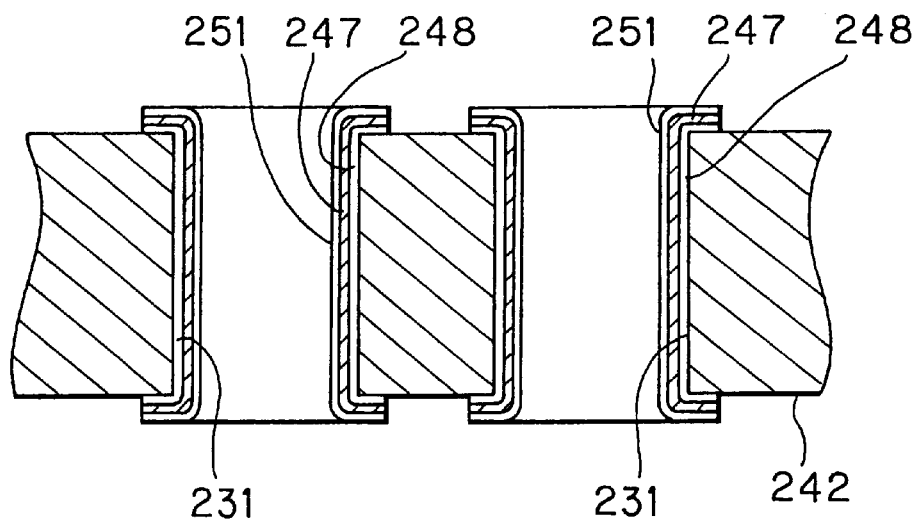
FIG. 35 is a cross-sectional view showing an example in which an electrically conductive film is provided along with a magnetic film on the inner periphery of a through-hole formed in the printed circuit board.

In the socket for an IC 249 according to the present invention, an electrically conductive film 251 may further be formed on the magnetic film 247 of each through-hole 231, as shown in FIG. 35. The electrically conductive film 251 may be formed by the electroless method or by the electric plating method, and may be constituted as a three-layer film of, for example, an Au film or a Cu film, a Ni film and an Au film. The coil-shaped contact 233 is arranged in the through-hole 231 on the inner surface of which are layered the magnetic film 247 and the electrically conductive film 251.

Figure 36:
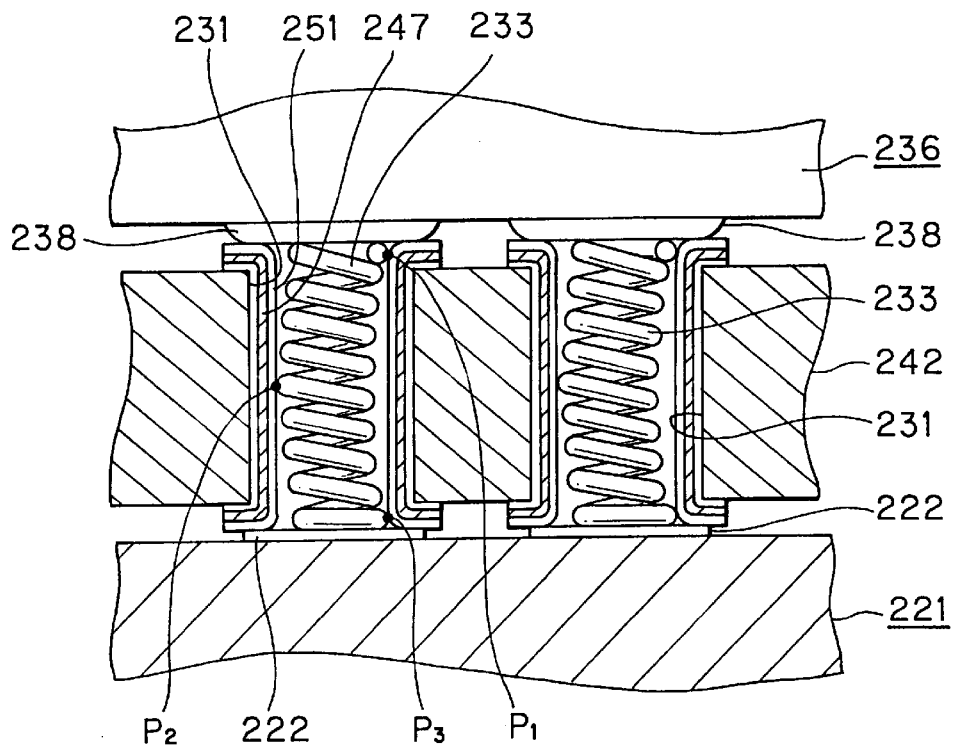
FIG. 36 is a partial cross-sectional view showing the state in which an IC has been loaded on a socket for an IC of the present invention employing the printed circuit board shown in FIG. 35.

If the IC 236 is loaded in position in the second recess 229 of the socket for an IC 249, formed with through-holes 231, on the inner peripheral surfaces of which the magnetic film 247 and the electrically conductive film 251 are deposited, the coil-shaped contacts 233 are thrust and compressed by the bumps 238 provided on the lower surface of the IC 236, as shown in FIG. 36. The coil-shaped contact 233 are compressed against the bumps 238 under the elastic recoiling force produced on compression by the bumps 238, so that the coil-shaped contacts 233 are contacted positively with the bumps 238. When compressed by the bump 238, the coil-shaped contact 233 is deformed in the through-hole 231 so that its axis departs from true vertical and hence the coil-shaped contact 233 is partially contacted with the electrically conductive film 251 formed on the inner peripheral surface of the through-hole 231. At this time, the coil-shaped contact 233 is contacted with the electrically conductive film 251 at three points, that is at P1, P2 and P3, as shown in FIG. 36. In such case, shorting is induced by the electrically conductive film 251 across the points P1 and P3, such that the portion of the electrically conductive film 252 between the points P1 and P3 operates, in conjunction with the coil-shaped contact 233, as a connection conductor between the bump 238 and the contact electrode 222. Since the connection resistance across the bump 238 and the contact electrode 222 is thereby decreased significantly, and the inductance is also decreased, the electrical properties of the socket can be improved significantly.

Figure 37:
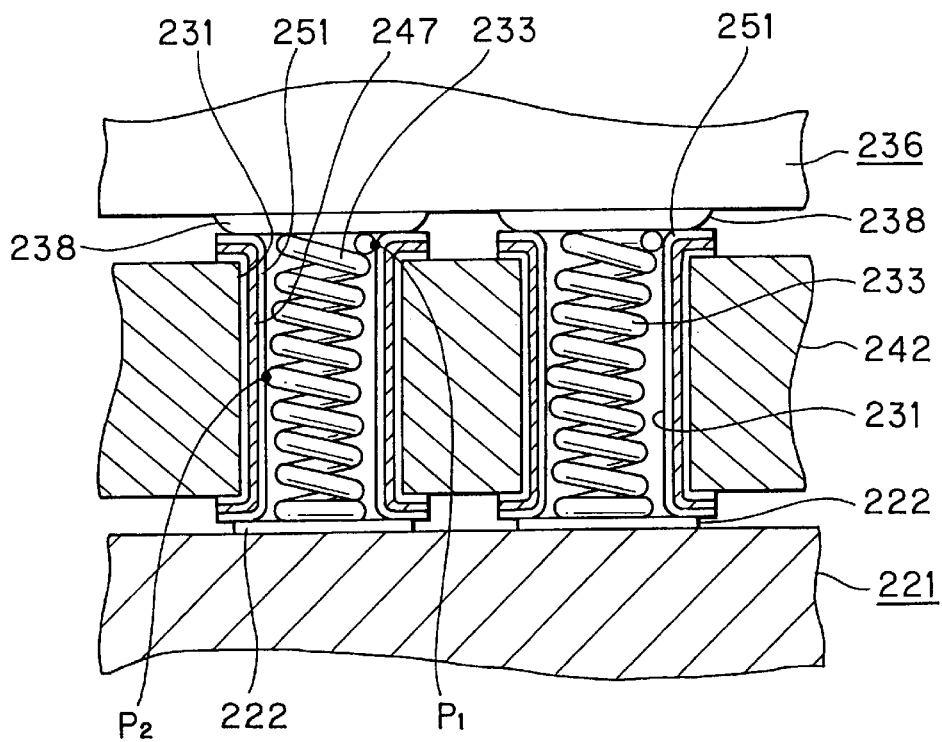
FIG. 37 is a partial cross-sectional view showing another example of the state in which an IC has been loaded on a socket for an IC of the present invention employing the printed circuit board shown in FIG. 35.
Figure 38:
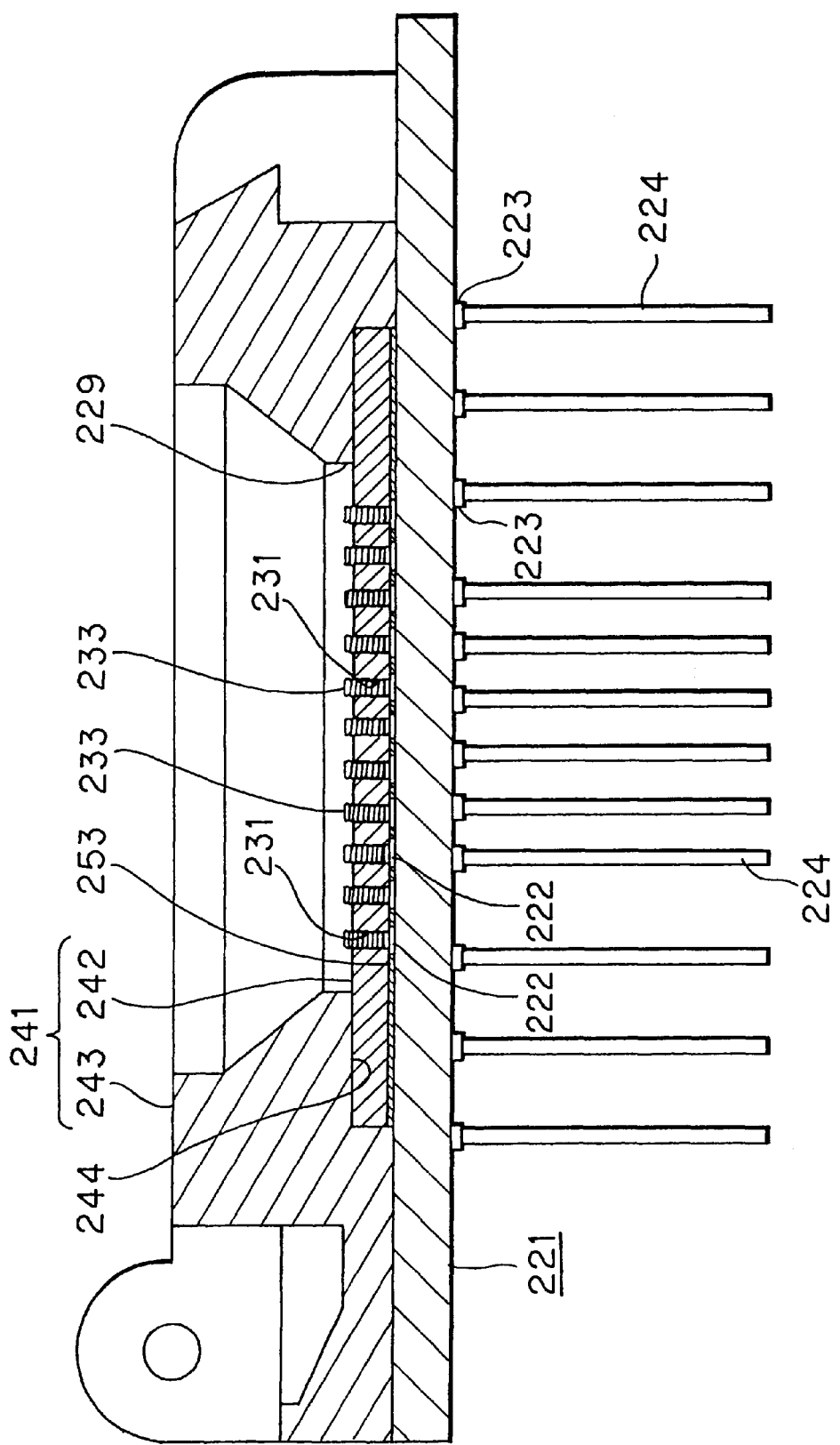
FIG. 38 is a cross-sectional view showing yet another example of a socket for an IC according to the present invention.

In an ideal state, the coil-shaped contact 233 can be compressed by the bump 238 without its axis departing from the true vertical. In actuality, however, the coil-shaped contact 233 is warped in this manner due to such factors as shape, size or accuracy of the bump 238 or the coil-shaped contact 233. In this case, the coil-shaped contact 233 and the electrically conductive film 252 may possibly be contacted with each other at two points of P1 and P2, as shown in FIG. 37, in distinction from the state shown in FIG. 36. However, the portion of the electrically conductive film 252 between the points P1 and P2 then operates as a connection conductor. For realizing optimum warping of the coil-shaped contact 233 and optimum pressure-contacting state of the coil-shaped contact 233 with the electrically conductive film 251 by such warping, a denser winding pitch of the coil-shaped contact 233 is desirable.

In the above-described socket for an IC 249, since the coil-shaped contact 233 is simply inserted and placed in the through-hole 231, the coil-shaped contact 233 tends to be detached from the inside of the through-hole 231 during manipulation of the socket 249.

For preventing such accidental detachment of the coil-shaped contact 233, an anisotropic electrically conductive adhesive sheet 253 may be interposed between the printed circuit board 221 and the guide plate 242 of the base block 241 and the coil-shaped contact 233 may be secured to this anisotropic electrically conductive adhesive sheet 253.

This anisotropic electrically conductive adhesive sheet 253 is constituted by an epoxy adhesive film in which micro-sized electrically conductive particles are dispersed uniformly. When thrust, the anisotropic electrically conductive adhesive sheet 253 generates anisotropic electrically conductivity in the thrusting direction. Preferably, the anisotropic electrically conductive adhesive sheet 253 is about 50 $\mu$m in thickness.

Figure 39:
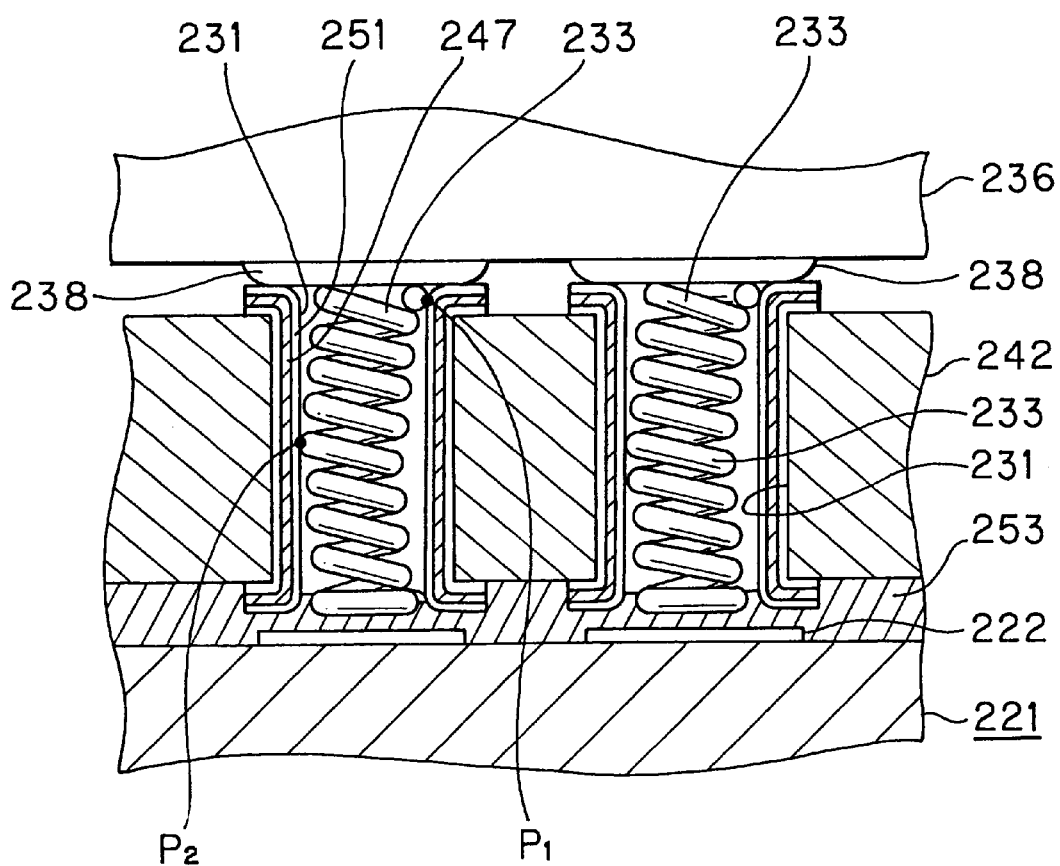
FIG. 39 is a partial cross-sectional view showing the state in which an IC has been loaded on the socket for an IC shown in FIG. 38.

The contact electrode 222 and the coil-shaped contact 233 face each other with the anisotropic electrically conductive adhesive sheet 253 in-between. The anisotropic electrically conductive adhesive sheet 253 is heated and cured, with the coil-shaped contacts 233 thrusting the anisotropic electrically conductive adhesive sheet 253, as shown in FIG. 39, whereby the contact electrode 222 and the coil-shaped contact 233 facing each other are mechanically and electrically interconnected in their entirety. The result is that the coil-shaped contacts 233 are held in the through-holes 231 and thereby safeguarded against accidental detachment.

Meanwhile, the guide plate 242 itself is bonded by this anisotropic electrically conductive adhesive sheet 253 to the printed circuit board 221. If the guide plate 242 is apso thrust with a pre-set force so that the electrically conductive sheet 251 is electrically connected to the contact electrodes 222 via the anisotropic electrically conductive adhesive sheet 253, with the coil-shaped contact 233 being thrust by the bump 238, with points P1 and P2 there of being in pressure contact with the electrically conductive film 251, as shown in FIG. 39, shorting is induced across P1 and the contact electrode 222 via the electrically conductive film 251 and the anisotropic electrically conductive adhesive sheet 253, thus further lowering the resistance.

Figure 40:
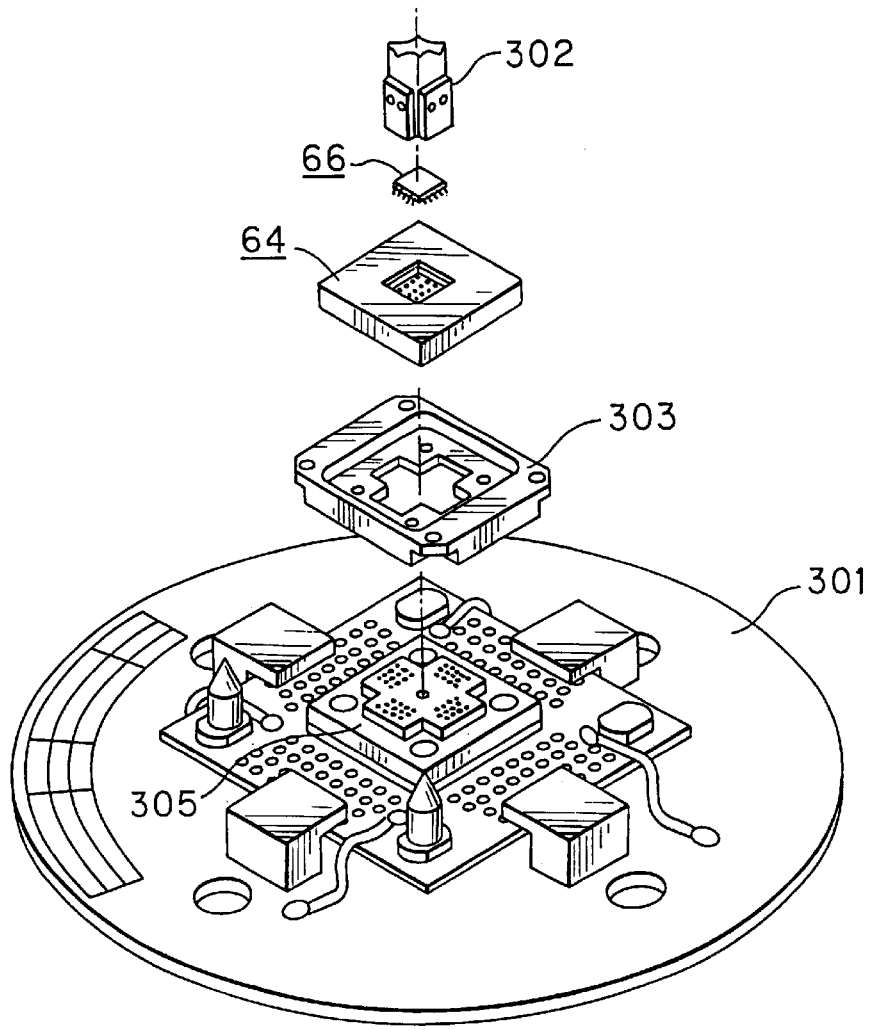
FIG. 40 is a perspective view showing the state of a test on an IC employing an IC socket according to the present invention.

The above-described socket for an IC, such as the socket for an IC 64, shown in FIG. 11, is used in a test step for electrical properties for an IC shown in FIG. 40, in the course of the manufacturing process for the IC 66, constructed as shown in FIG. 11.

In this test step for electrical properties for an IC, the socket for an IC 64, carrying the IC 66, is directly connected to a test board 301, as shown in FIG. 40. At this time, the IC 66 is loaded on the socket for an IC 64, using a jig 302, and the socket for an IC 64, carrying the IC 66, is loaded on a support member 303 and mounted in this state on a mounting base block 305 of the test board 301 with completed electrical connection.

Figure 41:
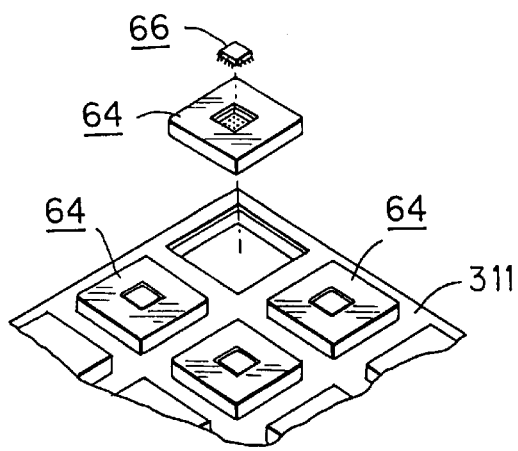
FIG. 41 is a perspective view showing another example of the state of a test on an IC employing an IC socket according to the present invention.

The socket for an IC 64 according to the present invention can also be used for a burn-in test for an IC, as shown in FIG. 41. In this case, a burn-in board test is carried out by connecting the socket for an IC 64 carrying the IC 66 to a burn-in board 311.

In the IC manufacturing process, an IC of high reliability can be manufactured by conducting various tests, such as those for electrical properties, using the inventive socket for the IC having optimum electrical properties.

INDUSTRIAL APPLICABILITY

With the socket for an IC according to the present invention, contact portions arranged in a matrix configuration at a dense pitch can be constructed by coil-shaped contacts connected electrically and mechanically using an anisotropic electrically conductive adhesive arranged on contact electrodes provided in a matrix configuration on a printed circuit board, so that the IC having bumps for external connection arranged in a matrix configuration can be loaded easily and reliably.

What is claimed is:

1. A socket for an IC comprising:
   a printed circuit board on one surface of which a plurality of contact electrodes are arranged at the same pitch as an arraying pitch of external electrodes for the IC and on the opposite surface of which are arranged a plurality of terminal electrodes connected to said contact electrodes;
   an anisotropic electrically conductive adhesive arranged on said contact electrodes of said printed circuit board;
   a base block arranged on said one surface of said printed circuit board and having an opening for setting said IC therein, said opening facing said anisotropic electrically conductive adhesive; and
   a plurality of coil-shaped contacts arranged in said opening, one ends of which are positioned above said contact electrodes via said anisotropic electrically conductive adhesive and the other ends of which are protruded from said opening;
   said contact electrodes and the coil-shaped contacts facing each other via said anisotropic electrically conductive adhesive being mechanically and electrically connected to each other via said anisotropic electrically conductive adhesive.

2. The socket for an IC according to claim 1 wherein said coil-shaped contacts are connected to said anisotropic electrically conductive adhesive by curing on heating.

3. The socket for an IC according to claim 1 wherein said opening is made up of a plurality of through-holes in which said coil-shaped contacts are positioned, with the ends of said coil-shaped contacts being protruded via upper portions of said through-holes.

4. The socket for an IC according to claim 1 wherein said terminal electrodes provided on said printed circuit board are formed at a pitch enlarged from the pitch of said contact electrodes.

5. The socket for an IC according to claim 1 wherein said opening in said base block is positioned facing said anisotropic electrically conductive adhesive on the bottom surface of a recess formed in an outer lateral surface at a mid portion of said base block.

6. The socket for an IC according to claim 5 further comprising:
   an adapter fitted in said recess for operating as a frame used to delimit the setting position for the IC.

7. A socket for an IC comprising:
   a printed circuit board on one surface of which a plurality of contact electrodes are arranged at the same pitch as an arraying pitch of external electrodes for the IC and on the opposite surface of which are arranged a plurality of terminal electrodes respectively connected to said contact electrodes;
   a base block for setting said IC therein, said base block being arranged on said one surface of said printed circuit board and having a plurality of through-holes facing sais contact electrodes;
   an electrically conductive film formed on an inner peripheral surface of each of said through-holes; and
   a plurality of coil-shaped contacts arranged in said plural through-holes, one ends of said coil-shaped contacts being contacted with said contact electrodes and the opposite ends thereof being protruded from said through-holes;
   said coil-shaped contacts having the opposite ends thereof thrust by said external electrodes of the IC so that the coil-shaped contacts are contacted with the electrically conductive films provided in said through-holes, said electrically conductive films operating in conjunction with said coil-shaped contacts as a connecting conductor between the external electrodes of the IC and said contact electrodes.

8. The socket for an IC according to claim 7 wherein said terminal electrodes formed on said printed circuit board are formed at a pitch enlarged from the pitch of the contact electrodes.

9. The socket for an IC according to claim 7 wherein an anisotropic electrically conductive adhesive is interposed between said printed circuit board and the base block, said contact electrodes and the coil-shaped contacts facing each other via said anisotropic electrically conductive adhesive being mechanically and electrically connected to each other via said anisotropic electrically conductive adhesive.

10. The socket for an IC according to claim 7 wherein an electrode film is formed as-one with said electrically conductive film on the rim of the opening of each through-hole towards the printed circuit board, said electrode film being electrically connected via the anisotropic electrically conductive adhesive to said contact electrodes adapted for facing said electrode film via said anisotropic electrically conductive adhesive.

11. A socket for an IC comprising:
   a printed circuit board on one surface of which a plurality of contact electrodes are arranged at the same pitch as an arraying pitch of external electrodes for the IC and on the opposite surface of which are arranged a plurality of terminal electrodes respectively connected to said contact electrodes;
   a base block for setting said IC therein, said base block being arranged on said one surface of said printed circuit board and having a plurality of through-holes facing sais contact electrodes;
   a magnetic film formed on an inner peripheral surface of each of said through-holes; and
   a plurality of coil-shaped contacts arranged in said plural through-holes, one ends of said coil-shaped contacts being contacted with said contact electrodes and the other ends thereof being protruded from said through-holes.

12. The socket for an IC according to claim 11 wherein an electrically conductive film is layered on the magnetic film provided on the inner peripheral surface of each of the through-hole.

13. The socket for an IC according to claim 11 wherein an anisotropic electrically conductive adhesive is interposed between said printed circuit board and the base block, said contact electrodes and the coil-shaped contacts facing each other via said anisotropic electrically conductive adhesive being mechanically and electrically connected to each other via said anisotropic electrically conductive adhesive.

14. The socket for an IC according to claim 11 wherein said terminal electrodes provided on said printed circuit board are formed at a pitch enlarged from the pitch of said contact electrodes.

15. A method for producing an IC using a socket for an IC comprising:

a printed circuit board on one surface of which a plurality of contact electrodes are arranged at the same pitch as an arraying pitch of external electrodes for the IC and on the opposite surface of which are arranged a plurality of terminal electrodes connected to said contact electrodes, an anisotropic electrically conductive adhesive arranged on said contact electrodes of said printed circuit board, a base block arranged on said one surface of said printed circuit board and having an opening for setting said IC therein, said opening facing said anisotropic electrically conductive adhesive, and a plurality of coil-shaped contacts arranged in said opening, one ends of which are positioned above said contact electrodes via said anisotropic electrically conductive adhesive and the other ends of which are protruded from said opening, said contact electrodes and the coil-shaped contacts facing each other via said anisotropic electrically conductive adhesive being mechanically and electrically connected to each other via said anisotropic electrically conductive adhesive, said method comprising:

a step of testing electrical properties of the IC with the IC being set on said base block of said socket for contacting said external electrodes of the IC with said coil-shaped contacts, with said terminal electrodes being connected to a test board.

16. The method according to claim 15 wherein said terminal electrodes provided on said printed circuit board of said socket for the IC are formed at a pitch enlarged from the pitch of said contact electrodes.

17. The method according to claim 15 wherein said opening provided in said socket for the IC is made up of a plurality of through-holes facing said contact electrodes via said anisotropic electrically conductive adhesive, said coil-shaped contacts being positioned in said through-holes.

18. The method according to claim 17 wherein an electrically conductive film is formed on the inner peripheral surface of the through-hole of said socket for the IC.

19. The method according to claim 17 wherein a magnetic film is formed on the inner peripheral surface of the through-hole of said socket for the IC.

20. The method according to claim 17 wherein a magnetic film and an electrically conductive film are layered on the inner peripheral surface of the through-hole of said socket for the IC.

* * * * *

UNITED STATES PATENT AND TRADEMARK OFFICE
CERTIFICATE OF CORRECTION

PATENT NO. : 6,174,174 B1            Page 1 of 1
DATED : January 16, 2001
INVENTOR(S) : Kenzo Suzuki et al.

It is certified that error appears in the above-identified patent and that said Letters Patent is hereby corrected as shown below:

<u>Title page,</u>
Item [22], should read -- [22] PCT Filed: December 4, 1998. --

Signed and Sealed this

Eighteenth Day of December, 2001

Attest:

Attesting Officer

JAMES E. ROGAN
*Director of the United States Patent and Trademark Office*